(12) United States Patent
Sasaki et al.

(10) Patent No.: US 6,313,665 B1
(45) Date of Patent: Nov. 6, 2001

(54) SEMICONDUCTOR INTEGRATED CIRCUIT

(75) Inventors: Yasuhiko Sasaki, Koganei; Kunihito Rikino, Tachikawa; Kazuo Yano, Hino; Shunzo Yamashita, Tokorozawa, all of (JP)

(73) Assignees: Hitachi, Ltd., Tokyo; Hitachi Device Engineering Co., Ltd., Chiba, both of (JP)

( * ) Notice: Subject to any disclaimer, the term of this patent is extended or adjusted under 35 U.S.C. 154(b) by 0 days.

(21) Appl. No.: 09/402,648

(22) PCT Filed: Apr. 11, 1997

(86) PCT No.: PCT/JP97/01269

§ 371 Date: Feb. 3, 2000

§ 102(e) Date: Feb. 3, 2000

(87) PCT Pub. No.: WO98/47180

PCT Pub. Date: Oct. 22, 1998

(51) Int. Cl.[7] ............... H01L 27/10; H03K 19/094; H03K 19/00

(52) U.S. Cl. .............. 326/101; 257/206; 326/113

(58) Field of Search .................... 257/206, 204, 257/207; 326/41, 101, 83, 113

(56) References Cited

U.S. PATENT DOCUMENTS

| 5,452,245 | 9/1995 | Hickman et al. |
| 5,581,202 | 12/1996 | Yano et al. |
| 5,808,483 | * 9/1998 | Sako ........................... 326/113 |

FOREIGN PATENT DOCUMENTS

| 5-122049 | 5/1983 | (JP) . |
| 4-56164 | 2/1992 | (JP) . |
| 7-106534 | 4/1995 | (JP) . |
| 7-130856 | 5/1995 | (JP) . |

OTHER PUBLICATIONS

J.H. Pasternak et al, "CMOS Differential Pass–Transistor Logic Design", IEEE Journal of Solid–State Circuits, vol. SC–22, No. 2, Apr. 1987, pp. 216–222.

K. Yano et al, "A 3.8–ns CMOS 16×16–b Multiplier Using Complementary Pass–Transistor Logic", IEEE Journal of Solid–State Circuits, vol. 25, No. 2, Apr. 1990, pp. 388–395.

K. Yano et al, "Lean Integration: Achieving a Quantum Leap in Performance and Cost of Logic LSIs", IEEE 1994 Custom Integrated Circuts Conference, 1994, pp. 603–606.

Proceedings of the 1994 IEICE Fall Conference, Institute of Electronics, Information and Communication Engineers (IEICE), p. 64, Sasaki et al. "Lean Integration With Pass Transistors".

* cited by examiner

Primary Examiner—Michael Tokar
Assistant Examiner—Daniel D. Chang
(74) Attorney, Agent, or Firm—Mattingly, Stanger & Malur, P.C.

(57) ABSTRACT

The I/O terminal positions of a pass transistor logic circuit cell are distributed in the cell, an output amplifier is provided on the end part of the cell, the pass transistor circuit is arranged in the direction in which a potential supply line extends, a signal polarity inverting circuit is laid out in the cell and the arrangement of wells is different from the arrangement of a conventional CMOS logic circuit.

27 Claims, 15 Drawing Sheets

SEMICONDUCTOR INTEGRATED CIRCUIT

TECHNICAL FIELD

The present invention relates to a semiconductor integrated circuit, particularly to a semiconductor integrated circuit applicable to LSI for a general use processor, a signal processing processor, an image processing processor or the like partially including logical operation circuits.

BACKGROUND OF THE INVENTION

Conventionally, in realizing a large scale logical operation circuit, there has widely been used systems of gate array, standard cell (or cell base integrated circuit) and the like. In these integrated circuits, a partial circuit referred to as cell is prepared previously. A cell signifies a small scale logical operation circuit in which layout of a mask pattern has been completed, normally, a plurality of them are arranged on the same chip. In respect of a cell, normally, other than mask layout, positions and areas of input and output terminals, an operational speed, power consumption and the like are prepared. A cell library stores information with regard to the cell in a storage device for assisting design of an integrated circuit. There has been known a design system using such cells, which is combined with a circuit referred to as a pass transistor circuit.

Pass transistor circuits have been introduced as "Differential Pass-transistor Logic" in IEEE Journal of Solid-State Circuits, Vol. sc-22, No. 2, April 1987 pp216–pp222 (hereinafter, referred to as a first conventional technology) and as "Complementary Pass-transistor Logic" in IEEE Journal of Solid-State Circuits, Vol. sc-25, No. 2, April 1990 pp388–pp395 (hereinafter, referred to as a second conventional technology).

Further there has been shown a circuit design method in which a pass transistor circuit is combined with a standard cell system, mentioned above, in Custom Integrated Circuits Conference 1994 Digest pp603–pp606 (hereinafter, referred to as a third conventional technology).

Further, there has also been introduced a design method in which a pass transistor circuit is combined with the standard cell system by utilizing a logical expressing method referred to as "Binary Decision Diagram" in Proceedings of the 1994 IEICE fall conference (basic and boundary region) of the Institute of Electronics, Information and Communication Engineers (IEICE), pp64 (hereinafter, referred to as a fourth conventional technology).

Further, there has been shown a logical operation circuit cell using a pass transistor circuit in Japanese Patent Laid-Open No. 130856/1995 (hereinafter, referred to as a fifth conventional technology).

DISCLOSURE OF THE INVENTION

FIG. 10 and FIG. 11 illustrate plane views (a) for explaining layout of cells of conventional CMOS logical operation circuits and circuit diagrams thereof (b). Notations p1001 through p1003, n1001 through n1003, p1101 through p1103 and n1101 through n1103 designate transistors. According to the layout of a cell of a CMOS logical operation circuit which has widely been used in a conventional gate array or standard cell system shown by FIG. 10 or FIG. 11, it is general to regularly arrange on a straight line input and output terminals In1001 through In1003 and In1101 through In1103 for outputting a signal to outside of the cell. This is because in the case of a CMOS logical operation circuit, a portion of a gate can be enlarged on an insulating film (not formed with transistor) present between a first type of a field effect transistor (for example, P-channel MOS) and a second type of a field effect transistor (for example, N-channel MOS) which are in a complementary relationship and accordingly, input and output terminals (In1001, In1002, In1003 and Out10 in FIG. 10, In1101, In1102, In1103 and Out11 in FIG. 11) can easily be enlarged therefrom by a conductor layer.

In the meantime, a pass transistor logical operation circuit cell is constituted by one set or more of pairs of two pass transistors, a gate of each of which responds to a complementary signal and an output signal amplifier. It is a significant feature of a pass transistor logical operation circuit cell that a logical circuit portion and an amplifying circuit portion are separated in this way. In cell layout of such a pass transistor circuit, when input and output terminals are arranged on a straight line similar to a cell of the conventional CMOS logical operation circuit, there poses a problem in which an area efficiency is deteriorated by a restriction of a design rule concerning a conductor layer. Accordingly, in a pass transistor logical operation circuit cell, it is not well known how these input and output terminals are to be arranged.

Further, in laying out a pass transistor logical operation circuit having the above-described constitution, it has not been well known with regard to a problem of how to arrange the output signal amplifier and the pairs of pass transistors.

Further, in the case of laying out a pass transistor logical operation circuit cell having the above-described constitution and a CMOS logical operation circuit cell on the same chip, it has not been well known with regard to how to arrange a semiconductor region surrounding each transistor and having a type reverse to a type of the transistor (for example, n well in the case of pMOS transistor) in the cell.

Further, it has not been well known with regard to at which portion in a layout inside of a cell as well as outside of a cell, a circuit for generating complementary signals provided to respective gates in a pair of two pass transistors in the above-described pass transistor logical operation circuit cell, is to be arranged.

Further, in laying out field effect transistors constituting respectives of a signal polarity inverting circuit for forming complementary signals provided to respective gates of a pair of two pass transistors of the above-described pass transistor logical operation circuit and the above-described output signal amplifier, it has not been well known with regard to at which positions and in what magnitude relationship they are to be laid out.

Therefore, it is an object of the present invention with regard to a cell using a pass transistor circuit, to provide a semiconductor integrated circuit having a layout arrangement of input and output terminals, an output signal amplifier, pairs of pass transistors, well regions and a complementary signal generating circuit capable of reducing an area, reducing a delay time period and facilitating wirings outside of the cell.

In order to achieve the above-described object, a semiconductor integrated circuit according to the present invention is laid out under the following thought.

According to the present invention, there is used a cell having a portion constituted by at least one pass transistor circuit for forming a logic and at least one output signal amplifier. In this case, as a typical example of the present invention, an explanation will be given of a pass transistor logical operation circuit cell in the case in which three of pass transistor circuits are present in respect of a single output signal amplifier. As will be shown later in an embodiment of FIG. 1 through FIG. 3, each pass transistor circuit includes a first input node, a second input node and a third input node, an output node, a field effect transistor of a first type or a second type, a source/drain path of which is connected between the first input node and the output node and a field effect transistor of the first type or the second type, a source/drain path of which is connected between the second input node and the output node.

In this case, an output signal amplifier includes a circuit comprising an input node, an output node, a field effect transistor of a first type, a drain/source path of which is connected between the output node and first potential and a gate of which responds to the input node and a field effect transistor of a second type, a drain/source path is connected between the output node and second potential and a gate of which responds to the input node.

The output node of the pass transistor circuit is connected to the input of the output signal amplifier, an input signal is applied from outside of the cell to the third input node of the pass transistor circuit and the input signal from outside cell is applied to at least two of all of the first input node and the second input node of the pass transistor circuit.

The output node of the output signal amplifier operates to output an output signal to outside of the cell. One aspect of the thought of the present invention is characterized in arranging respective terminals by a conductor layer for drawing an input signal from outside of the cell and an output signal to outside of the cell. These are arranged as follows. That is, when a coordinate system (coordinate axes) is determined in a direction of running a supply line of the first potential and a supply line of the second potential and a direction orthogonal thereto, the terminals are arranged to include terminal grid points disposed at constant intervals in the coordinate system and at least one-of terminal grid coordinates of the respective terminals differ from terminal grid coordinates arranged with at least two or more of the terminals other than the above terminals.

According to the above-described semiconductor integrated circuit of the present invention, when the coordinate system is disposed in the running direction of the potential supply line and the direction orthogonal thereto, input and output terminals are not disposed on the same coordinates. In other words, the input and output terminals are not aligned in a row, more specifically, these are not aligned in a row in a direction in parallel with the potential supply lines or a boundary line (contour) of the cell. Therefore, by providing an input to the gate of the pass transistor and an input to the source/drain of the pass transistor in directions of the coordinate system under the space rule of the conductor layer, the size of the cell can be reduced with regard to the direction of potential supply lines. In this case, the space rule refers to a rule of a minimum distance to prevent shortcircuit from causing in consideration of a deviation in matching a mask and a deviation in a process fabrication accuracy. Generally, with regard to the direction orthogonal to the direction of running the potential supply lines, the size of the cell is determined commonly in respect of all of cell groups used in blocks in the chip and accordingly, being capable of reducing the size in the direction of the potential supply lines, signifies being capable of reducing the area of the cell. Further, when wirings are provided among cells at an upper layer, the wirings need to draw from the input and output terminals and also in this case, since the input and output terminals are not disposed on the same coordinates, the wirings can be drawn from the respective terminals not only in the longitudinal direction but also in the transverse direction and there is achieved an advantage of promoting the degree of freedom of wirings.

According to a preferable embodiment of the present invention, when the coordinate system is determined in the direction orthogonal to the direction of running the supply line of the first potential and the supply line of the second potential, a terminal from outside of the cell for inputting an input signal applied to the third input node of the pass transistor circuit, is arranged to shift to a larger side or a smaller side in view of the coordinate system than a terminal from outside of the cell for inputting an input signal applied to the first input node and the second input node of the pass transistor circuit.

That is, according to the above-described semiconductor integrated circuit of the present invention, as will be explained later in the example of FIG. 1 through FIG. 3, the layout can be conducted reasonably since a wiring drawn from source/drain of a transistor of the pass transistor circuit to an input terminal and a wiring drawn from gate to the input terminal do not intersect with each other, whereby the size of the cell can be reduced.

Further, according to other preferable embodiment of the present invention, when two types of field effect transistors constituting the output signal amplifier determine the coordinate system in the direction of running the supply line of the first potential and the supply line of the second potential, the transistors are arranged to shift to at least one of the boundaries of the cell on a side where the coordinate values are minimized or on a side where the coordinate values are maximized.

That is, according to the above-described embodiment of the present invention, the output signal amplifier is arranged to shift to the cell boundary with regard to the direction of running the potential supply line and accordingly, even when a plurality of the pass transistor circuits are present, the output signal amplifier does not hinder wire connection among the plurality of pass transistor circuits and accordingly, the cell can reasonably be laid out to a small area.

Further, according to other preferable embodiment of the present invention, when a plurality of pass transistors circuit are present, the pass transistor circuits are developed to arrange successively in the direction of running the supply line of the first potential and the supply line of the second potential.

According thereto, even when the plurality of pass transistor circuits are present, a number thereof can be increased flexibly in the developing direction and accordingly, even when the number of the pass transistor circuits is increased, a cell library can regularly be laid out. Thereby, a time period consumed in layout design of the pass transistor logical operation circuit cell can be reduced.

Further, when the plurality of pass transistor circuits are present and the pass transistor circuits are developed to arrange in the direction of running the supply line of the first potential and the supply line of the second potential, a width of a source/drain region of a field effect transistor constituting the pass transistor circuit in the direction of running the supply line of the first potential and the supply line of the second potential is changed in accordance with locations in the same source/drain region. That is, the width is widened at a portion having contact and is narrowed at a portion having no contact.

According to the above-described constitution, the layout can be conducted such that the width of the source/drain region becomes a necessary source/drain width simply for constituting the transistor rather than a width prescribed by source/drain including contact and accordingly, in applying a space rule between source and drain (referred to as SD space rule), a source/drain region of a contiguous pass transistor circuit is made contiguous to the source/drain region of a portion having no contact by which the size in the running direction of the potential supply line can be reduced.

Further, the above-described cell is preferably constituted as follows. When a field effect transistor of a first type and a field effect transistor of a second type are arranged contiguously to a CMOS logical operation circuit cell constituting a logic by coupling them in a complementary relationship, the following constitution is preferable.

That is, a boundary of a semiconductor region of the second type surrounding the first type of the field effect transistor constituting the CMOS logical operation circuit and a semiconductor region of the first type surrounding the second type of the field effect transistor, and a boundary of a semiconductor region of the second type surrounding the first type of the field effect transistor constituting the pass transistor logical operation circuit and a semiconductor region of the first type surrounding the second type of the field effect transistor, are constituted to linearly connect at a connecting portion.

According to the above-described semiconductor integrated circuit of the present invention, when the cells are contiguous to each other, the well boundaries are linearly connected and therefore even when a minimum width of a region surrounding a transistor (referred to as a well minimum width) prescribed by the design rule, is not satisfied by a single cell, the rule can be satisfied by contiguously arranging a plurality of cells. Accordingly, as a result, the cell area can be reduced. When the embodiment according to the present invention is not used, in the case of arranging a pass transistor logical operation circuit cell and a CMOS logical operation circuit cell within the same block on the same chip, design rule error may be caused, for example, at a location where a single cell which cannot satisfy the rule of the well minimum width is arranged isolatedly. However, when the cell layout according to the present invention is carried out, the problem is resolved.

Further, as will be explained later in reference to FIG. 4 and FIG. 5, other preferable aspect of the present invention is characterized in that a boundary (referred to as well boundary) of a semiconductor region of the second type (referred to as second well) surrounding a field effect transistor of the first type constituting the pass transistor logical operation circuit and a semiconductor region of the first type (referred to as first well) surrounding the field effect type transistor of the second type, is brought to a side of the first semiconductor or to a side of the second semiconductor at inside of the cell and is arranged to be nonlinear at inside of the cell.

Thereby, regions of the field effect transistors constituting the pass transistor circuit can effectively be provided within the cell. That is, according to the CMOS logical operation circuit cell, normally, a transistor of the first type and a transistor of the second type are in a complementary relationship and their numbers coincide with each other. Therefore, transistors having the same numbers can be laid out on both sides of a well boundary drawn linearly with no problem. However, in the case of the pass transistor logical operation circuit cell, a number of transistors of a type the same as a type of transistors constituting the pass transistor circuit, is larger than a number of transistors of a type different therefrom. Meanwhile, when the boundary of the well is linearly laid out in the cell to be linearly connected to the CMOS logical operation circuit cell, even when there is constituted a distribution ratio of the first well and the second well suitable for the CMOS logical operation circuit, it becomes a distribution ratio which is not suitable for the pass transistor logical operation circuit cell in which a number of one type is larger than a number of other type. However, when the above-described embodiment of the present invention is used, a region for a transistor constituting the pass transistor circuit can be widened at inside of the cell and accordingly, a difference in the numbers of transistors can successively be realized.

Further, as will be explained in details in reference to FIG. 2, the semiconductor integrated circuit according to the present invention uses a cell comprising a pass transistor logical operation circuit having at least one set of pairs each of a pass transistor circuit and an inverter circuit of the signal polarity and at least one output signal amplifier. According to the pass transistor operation circuit of the logical operation circuit, there are provided a first input node, a second input node and a third input node, an output node, a field effect type transistor of a first type or a second type, a source/drain path of which is connected between the first input node and the output node and a field effect transistor of the first type or the second type, a source/drain path of which is connected between the second input node and the output node.

In this case, the signal polarity inverting circuit includes a circuit comprising, for example, an input node, an output node, a field effect type transistor of a first type, a drain/source path of which is connected between the output node and first potential and a gate of which responds to the input node and a field effect transistor of a second type, a drain/source path of which is connected between the output node and the second potential and a gate of which responds to the input node.

In this case, the output signal amplifier includes a circuit comprising an input node, an output node, a field effect transistor of a first type, a drain/source path of which is connected between the output node and first potential and a gate of which responds to the input node and a field effect transistor of a second type, a drain/source path of which is connected between the output node and second potential and a gate of which responds to the input node.

Further, the output node of the pass transistor circuit is connected to the input of the output signal amplifier. In this way, it signifies that by inserting the signal polarity inverting circuit to inside of the cell, one of input terminals constituting signal connection to outside of the cell is reduced in respect of a set of a pair of the pass transistor circuits and the signal polarity inverting circuit. This signifies that an amount of wiring at outside of the cell is reduced in comparison with the case in which the signal polarity inverting circuit is laid out at outside of the cell and connected therefrom to two of the input terminals of one pass transistor circuit and wiring is easy to carry out since a crowdedness of wiring at outside of the cell can be reduced, which is effective. Further, it is preferable that a difference between delay times of complementary signals which are to be inputted to two input terminals of one pass transistor circuit, is small. Because, when the difference between the delay times is large, although the above-described pass transistor circuits are originally fabricated by assuming that only one of them is made ON, there causes a case in which both are made ON or the case both are made OFF. Now, when gate inputs of two pass transistors to which the above-described complementary signals are inputted, are drawn to outside of the cell independently from each other, it is conceivable that complementary signals are transmitted to these two inputs by using separate wirings. In such a case, when there is considerable discrepancy in arrival times of signals by reason in which lengths of the separate wirings differ, there can be brought about an unpreferable situation in which both are made ON or both are made OFF as mentioned above. However, according to the semiconductor integrated circuit of the above-described embodiment of the present invention, the signal polarity inverting circuit is inserted to inside of the cell and accordingly, the difference between the delay times to the gate inputs of the two pass transistors can be restrained to a small value of only a delay time of the signal polarity inverting circuit at most.

Further, as in later detailed explanation of a constitution in reference to FIG. 1 and FIG. 2, in a cell comprising a pass transistor logical operation circuit having at least a set of pairs each of a pass transistor circuit and a signal polarity inverting circuit and at least one output signal amplifier, the signal polarity inverting circuit in the logical operation circuit includes a circuit comprising an input node, an output node, a field effect transistor of a first type, a drain/source path of which is connected between the output node and first potential and a gate of which responds to the input node and a field effect transistor of a second type, a drain/source path of which is connected between the output node and second potential and the gate of which responds to the input node.

The output signal amplifier in the logical operation circuit includes a circuit comprising an input node, an output node, a field effect transistor of a first type, a drain/source path of which is connected between the output node and first potential and a gate of which responds to the input node and a field effect transistor of a second type, a drain/source path is connected between the output node and second potential and a gate of which responds to the input node.

The output node of the pass transistor circuit is connected to the input of the output signal amplifier, the first type of the field effect transistor constituting the output signal amplifier is provided with a gate width larger than that of the first type of the field effect transistor constituting the signal polarity inverting circuit and the second type of the field effect transistor constituting the output signal amplifier is provided with a gate width larger than that of the second type of the field effect transistor constituting the signal polarity inverting circuit.

One aspect of the present invention clearly provides a guiding principle in how to design the channel width of the field effect transistor constituting the signal polarity inverting circuit. That is, a circuit outside of the cell driven by the output signal amplifier is not known at a time point of the layout, in consideration of fanout or a wire capacity at outside of the cell, there must be assumed a case of driving a comparatively large load capacity, in contrast thereto, the signal polarity inverting circuit may only drive the gate of the pass transistor circuit at inside of the cell. When the channel width of the field effect transistor constituting the signal polarity inverting circuit is made larger than the channel width of the field effect transistor constituting the output signal amplifier, regardless of the relationship of the load capacity, large capacity is driven by a small transistor and small load capacity is driven by large capacity, as a result, there poses a problem in which a delay time period of a total is increased. In contrast thereto, by conducting layout such that the channel width of the field effect transistor constituting the signal polarity inverting circuit is made smaller than the channel width of the field effect transistor constituting the output signal amplifier, the respectives can be constituted by transistor sizes pertinent to driven load capacities and the delay time period can be reduced.

Further, according to a preferable embodiment of the present invention, the output node of the pass transistor circuit is connected to the input of the output signal amplifier and the field effect transistor constituting the pass transistor circuit, is arranged between field effect transistors of a first type and a second type constituting the signal polarity inverting circuit with regard to a direction orthogonal to a direction of running a supply line of the first potential and a supply line of the second potential.

By arranging them in this way, the space rule in view of layout between the source/drain region and the semiconductor region (well or substrate) surrounding thereof is not adopted unnecessarily, wire connection among pass transistor circuits and installation of an electricity feeding line to the source of the signal polarity inverting circuit can reasonably be carried out and accordingly, as a result, the cell area can be reduced.

Further, preferably, the output signal amplifier in the logical operation circuit includes a circuit comprising an input node, an output node, a first field effect transistor of a first type, a drain/source path of which is connected between the output node and first potential and a gate of which responds to the input node, a second field effect transistor of a second type, a drain/source path of which is connected between the output node and second potential and a gate of which responds to the input node and a third field effect transistor of the first type, a drain/source path of which is connected between the input node and the first potential and a gate of which responds to the output node. Further, according to the output signal amplifier, wire connection from the drain of the third field effect transistor to the gates of the first field effect transistor and the second field effect transistor is realized by passing the wire connection below a first potential supply line by using a material for the gate terminal of the transistor.

In this way, by using the gate material as a wiring, the portion below the potential supply line can effectively be utilized and accordingly, there can be resolved a problem in which wiring operation becomes difficult which is caused when wirings at vicinities of the first field effect transistor and the third field effect transistor of the output signal amplifier are crowded.

Other objects and novel characteristics of the present invention will become apparent by the following embodiments.

BEST MODE FOR CARRYING OUT THE INVENTION

An explanation will be given of embodiments according to the present invention in reference to the drawings as follows.

Figure 1:
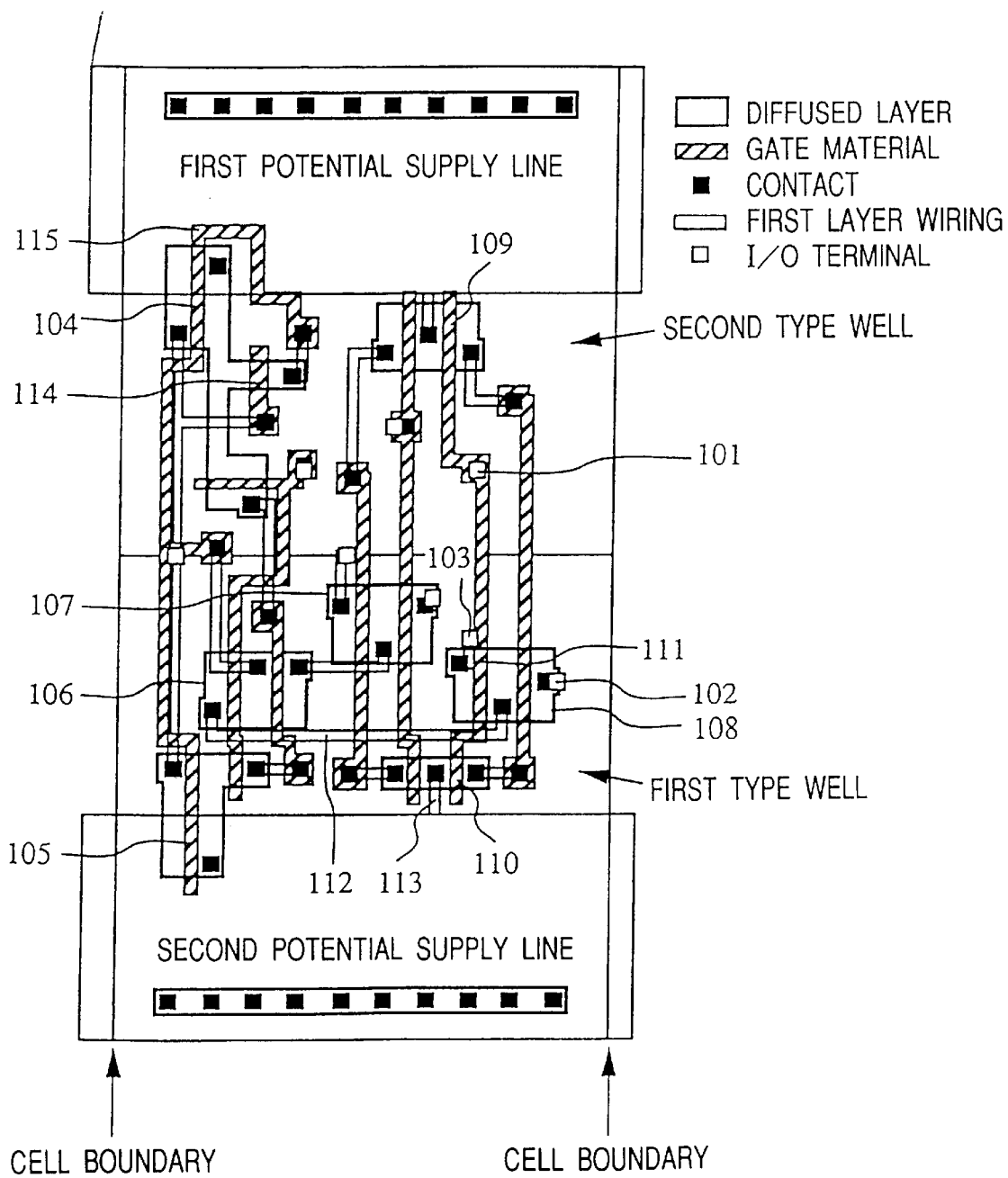
FIG. 1 is a layout diagram of a logical operation circuit cell according to an embodiment of the present invention.

FIG. 1 illustrates layout of a pass transistor logical operation circuit cell when three of pass transistor circuits are present in respect of one output signal amplifier.

Figure 2A:
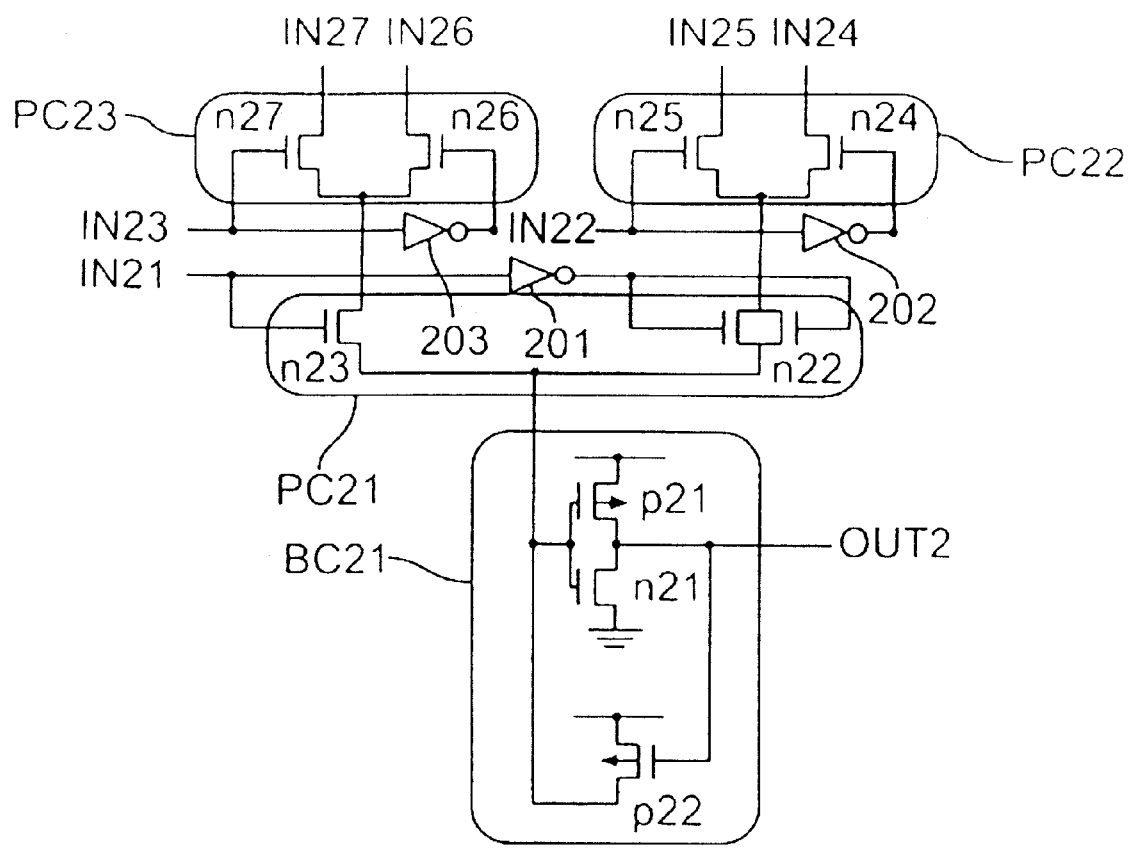
FIG. 2 is a circuit diagram of the logical operation circuit cell according to the embodiment of the present invention.
Figure 2B:
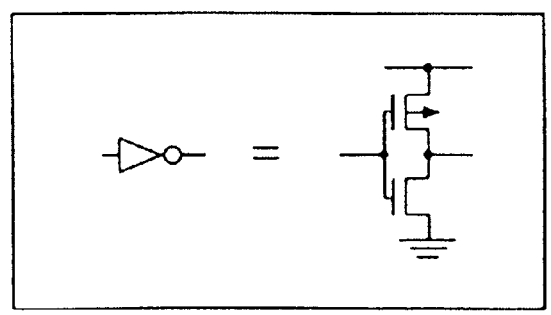

FIG. 2 illustrates a circuit in correspondence with FIG. 1. Basically, there are provided a logical circuit portion (PC21 through PC23) constituted by nMOS's, input amplifiers (inverters 201 through 203) constituted by CMOS's and an output amplifier (BC21). First, a description will be given of correspondence between layout and circuit.

Figure 3:
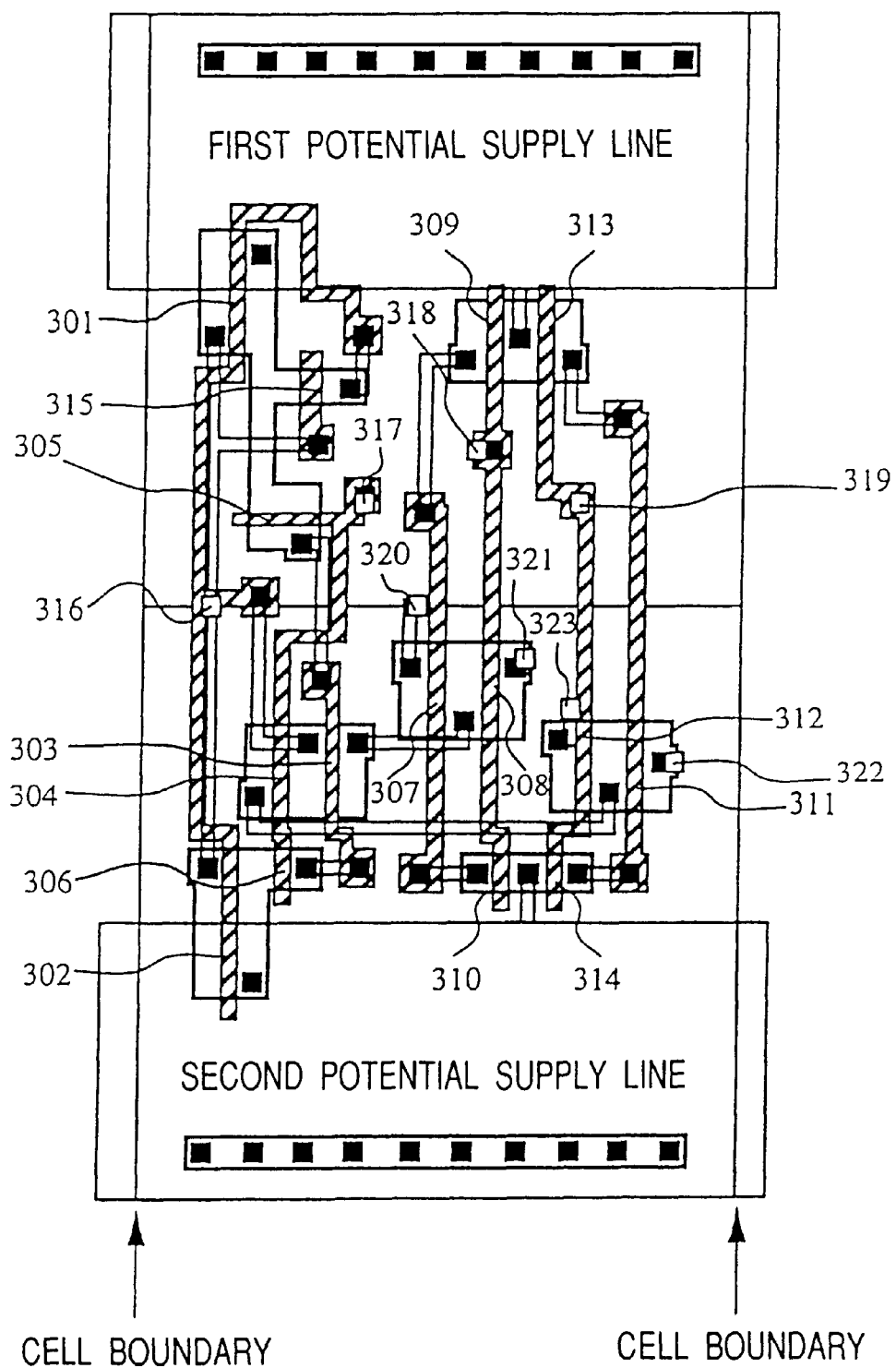
FIG. 3 is a layout diagram of the logical operation circuit cell according to the embodiment of the present invention.

FIG. 3 shows correspondence between FIG. 1 and FIG. 2. Although layout of FIG. 3 is the same as that of FIG. 1, the layout shows transistors and input and output terminals along with numerals. Correspondence between these and transistors and input and output terminals in FIG. 2 is as follows.

p21 of FIG. 2 corresponds to 301 of FIG. 3, n21 of FIG. 2 corresponds to 302 of FIG. 3, n22 of FIG. 2 corresponds to 303 of FIG. 3, n23 of FIG. 2 corresponds to 304 of FIG. 3, n24 of FIG. 2 corresponds to 307 of FIG. 3, n25 of FIG. 2 corresponds to 308 of FIG. 3, n26 of FIG. 2 corresponds to 311 of FIG. 3, n27 of FIG. 2 corresponds to 312 of FIG. 3, Out2 of FIG. 2 corresponds to 316 of FIG. 3, In21 of FIG. 2 corresponds to 317 of FIG. 3, In 22 of FIG. 2 corresponds to 318 of FIG. 3, In23 of FIG. 2 corresponds to 319 of FIG. 3, In24 of FIG. 2 corresponds to 320 of FIG. 3, In25 of FIG. 2 corresponds to 321 of FIG. 3, In26 of FIG. 2 corresponds to 322 of FIG. 3 and In27 of FIG. 2 corresponds to 323 of FIG. 3.

Further, the inverter 201 is constituted by transistors 305 and 306 of FIG. 3, The inverter 203 of FIG. 2 is constituted by transistors 313 and 314 of FIG. 3, and the inverter 202 of FIG. 2 is constituted by transistors 309 and 310 of FIG. 3 and p22 of FIG. 2 corresponds to 315 of FIG. 3.

The semiconductor integrated circuit according to the present invention is laid out by the following thought. According to the present invention, there is used a cell (FIG. 1 and FIG. 2) comprising a logical operation circuit having at least one of pass transistor circuits (PC21, PC22, PC23 of FIG. 2) and at least one output signal amplifier (PC21 of FIG. 2). In this case, as shown by FIG. 1 through FIG. 3, a pass transistor circuit in the logical operation circuit (PC21, PC22, PC23 of FIG. 2) includes a first input node, a second input node and a third input node, an output node, a field effect transistor of a first type or a second type (in FIG. 2, n22, n24 and n26), a source/drain path of which is connected between the first input node and the output node and a field effect transistor of the first type or the second type (in FIG. 2, n23, n25 and n27 of n type), a source/drain path of which is connected between the second input and the output node.

The output signal amplifier (BC21 of FIG. 2) in the logical operation circuit, includes an input node, an output node, a field effect transistor of a first type (in FIG. 2, p21 of p type), a source/drain path is connected between the output node and first potential and a gate of which responds to the input node and a field effect transistor of a second type (in FIG. 2, n21 of n type), a drain/source path is connected between the output node and second potential and a gate of which responds to the input node.

Further, the output node of the pass transistor circuit is connected to the input of the output signal amplifier, an input signal from outside of the cell is applied to the third input node of the pass transistor circuit and input signals from outside of the cell are applied to at least two of all of the first input nodes and the second input nodes of the pass transistor circuits (at least two of In21, In22, In23, In24, In25, In26 and In27 of FIG. 2).

The output node (Out2 of FIG. 2) of the output signal amplifier operates to output an output signal to outside of the cell. Respective terminals by a conductor layer (for example, 1-th layer of metal wiring) for drawing the input signals from outside of the cell and the output signal to outside of the cell, are arranged as follows. That is, when a coordinate system is determined in a direction of running a first potential supply line and a second potential supply line and a direction orthogonal thereto, the respective terminals are arranged to include terminal grid points disposed at constant intervals in the coordinate system, in which terminal grid coordinates of at least one of the respective terminals differ from terminal grid coordinates where at least two or more of terminals are arranged (101, 102, 103 etc of FIG. 1).

According to the semiconductor integrated circuit of the embodiment of the present invention as mentioned above, when a coordinate system is set in a direction of running the power supply lines and a direction orthogonal thereto, input and output terminals are not disposed on the same coordinates. Therefore, for example, by providing the space rule of the conductor layer in respect of input to a gate of a pass transistor and input to a source and a drain of the pass transistor in a direction (vertical direction in FIG. 1) of the above-described coordinate system, the size of the cell can be reduced in the direction of the potential supply lines (horizontal direction in FIG. 1). Generally, with regard to the direction of running the potential supply lines and the line orthogonal thereto (vertical direction in FIG. 1), the size of the cell is determined commonly in respect of all of cell groups used in blocks in a chip and accordingly, being capable of reducing the size in the direction of the potential supply lines (horizontal direction in FIG. 1), signifies being able to reduce the area of the cell. Further, when wirings are provided among cells at an upper layer, the wirings need to draw from the input and output terminals and also in this case, the input and output terminals are not disposed on the same coordinates and accordingly, the wirings can be drawn from the respective terminals not only in the vertical direction but also in the horizontal direction and there is achieved an advantage in which the degree of freedom of wiring is promoted.

Further, a terminal (which corresponds to 101 of FIG. 1, In23 of FIG. 2) from outside of the cell for an input signal applied to the third input node of the pass transistor circuit, is arranged to shift to a larger side or a smaller side in the coordinate system rather than terminals (which corresponds to 102 or 103 of FIG. 1, In26 and In27 of FIG. 2) from outside of the cell for input signals applied to the first input node and the second input node of the pass transistor circuit.

According to such a semiconductor integrated circuit, a wire which pulls the signal out from source/drain of a transistor in the pass transistor circuit (which corresponds to, for example, 108 of FIG. 1, PC23 of FIG. 2) to an input terminal (102 or 103) and a wire drawn from gate to an input terminal (101 of FIG. 1) do not intersect with each other and therefore, layout can be carried out reasonably by which the size of the cell can be reduced.

Further, the embodiment is characterized in that two types of field effect transistors (104, 105 of FIG. 1) constituting the output signal amplifier are arranged to shift to at least one of a boundary of the cell on a side of smallest coordinate values and a boundary of the cell on a side of largest coordinate values (left side in FIG. 1) when a coordinate system is determined in the direction of running the first potential supply line and the second potential supply line.

According to the above-described semiconductor integrated circuit in accordance with the embodiment of the present invention, the output signal amplifier is arranged to shift to the cell boundary with regard to the running direction of the potential supply line (horizontal direction of FIG. 1) (104, 105 of FIG. 1) and therefore, even when a plurality of the above-described pass transistor circuits are present (PC21, PC22, PC23 of FIG. 2), wire connection among the plurality of pass transistors is not hampered and therefore, the cell can be laid out reasonably in a small area.

Further, according to the embodiment, when the plurality of pass transistor circuits are present (for example, PC21, PC22, PC23 of FIG. 2), the pass transistor circuits are developed to arrange in the direction of running the first potential supply line and the second potential supply line. In FIG. 1, the pass transistor circuits are developed to arrange in an order of 106, 107 and 108.

According to the above-described semiconductor integrated circuit in accordance with the embodiment of the present invention, the output signal amplifier is arranged at an end of the cell (104, 105 of FIG. 1), even when a plurality of pass transistor circuits are present (for example, PC21, PC22, PC23 of FIG. 2), a number thereof can flexibly be increased in the developing direction and therefore, even when the number of the pass transistor circuits is increased, the cell library can regularly be laid out. Thereby, a time period consumed in layout design of a pass transistor logical operation circuit cell can be reduced.

Further, according to the embodiment, a width of a source/drain region of a field effect transistor constituting a pass transistor circuit (PC22 of FIG. 2 and 107 of FIG. 1 correspond thereto) in the direction of running the first potential supply line and the second potential supply line (leftist side of source/drain region in 107 of FIG. 1) is changed depending on locations in the same source/drain region. That is, in FIG. 1, the width is widened at an upper portion having contact and is narrowed at a lower portion having no contact.

In this way, the width of the source/drain region can be laid out by a source/drain width necessary for simply constituting a transistor rather than a width prescribed by source and drain and therefore, in applying the space rule (referred to as SD space rule between source and drain) by making a source/drain region of a contiguous pass transistor circuit to be contiguous to a source/drain region of a portion having no contact, the size in a direction of running of a potential supply line (horizontal direction in FIG. 1) can be reduced.

According to the embodiment, at inside of the cell, there are a pair of at least one set of pass transistor circuits (PC21, PC22, PC23 of FIG. 2) and a signal polarity inverting circuit (201, 202, 203 of FIG. 2) and at least one output signal amplifier (BC21 of FIG. 2). The signal polarity inverting circuit (201, 202, 203) includes a circuit comprising an input node, an output node, a field effect transistor of a first type, a drain/source path of which is connected between the output node and first potential and a gate of which responds to the input node and a field effect transistor of a second type, a drain/source path of which is connected between the output node and second potential and a gate of which responds to the input node.

In this way, by inserting the signal polarity inverting circuit to inside of the cell, a number of input terminals constituting signal connections to outside of the cell is reduced by one per a pair of one set of a pass transistor circuit and a signal polarity inverting circuit. This signifies that an amount of wiring at outside of the cell is reduced in comparison with the case in which the signal polarity inverting circuit is laid out at outside of the cell and connected therefrom to two input terminals of one pass transistor circuit, the degree of crowdedness of wirings at outside of the cell can be reduced and accordingly, wiring operation is easy to carry out. Further, it is preferable that a difference between delay time periods is small in complementary signals to be inputted to two input terminals of one pass transistor circuit. Because when the difference between the delay time periods is large although the above-described pass transistor circuit is originally fabricated by assuming that either one of them is made ON, there causes a case in which the both are made ON or the case in which both are made OFF. Now, when gate inputs of two pass transistors to which the above-described complementary signals are inputted, are drawn to outside of the cell independently from each other, it is conceivable that the complementary signals are transmitted to these two inputs by using separate wirings. In such a case, when there is a significant discrepancy between arrival times of the signals owing to the reason that lengths of the separate wirings differ, there can be brought about an unpreferable situation in which both are made ON or both are made OFF as mentioned above. However, according to the embodiment of the present invention, described above, the signal polarity inverting circuit is inserted to inside of the cell and accordingly, the difference between the delay time periods to the gate inputs of the two pass transistors can be restrained small only to a delay time period of the signal polarity inverting circuit at most.

In this case, the first type field effect transistor 104 constituting the output signal amplifier, is provided with a gate width which is larger than that of a first type field effect transistor 109 constituting the signal polarity inverting circuit. Further, the second type field effect transistor 105 constituting the output signal amplifier, is characterized in having a gate width which is larger than that of a second type field effect transistor 110 constituting the signal polarity inverting circuit. The gate width can be defined as, for example, a length in a length direction of a polysilicon layer at a portion thereof where a diffused layer and the polysilicon layer constituting a gate electrode overlap. As a characteristic, gain of the output signal amplifier is made larger than gain of the signal polarity inverting circuit.

That is, a circuit outside of the cell which is driven by the output signal amplifier is not known at a time point of laying out the cell, in consideration of fan-out and a capacity of wiring at the outside portion, there must be assumed a case of driving comparatively large load capacity, in contrast thereto, the signal polarity inverting circuit may only drive the gate of the pass transistor circuit at inside of the cell. When the channel width of the field effect transistor constituting the signal polarity inverting circuit is made larger than the channel width of the field effect transistor constituting the output signal amplifier, large capacity is driven by a small transistor and small load capacity is driven by large capacity regardless of the above-described relationship of load capacity, as a result, there poses a problem in which a delay time period of a total is increased. In contrast thereto, the channel width of the field effect transistor constituting the signal polarity inverting circuit is laid out to be smaller than the channel width of the field effect transistor constituting the output signal amplifier by which the respectives can be provided with transistor sizes pertinent for load capacity and the delay time period can be reduced.

According to the embodiment, the output node of the pass transistor circuit is connected to the input of the output signal amplifier, a field effect transistor (111) constituting the pass transistor circuit (PC21 of FIG. 2), is arranged between the first type and the second type field effect transistors (109 and 110) constituting the signal polarity inverting circuit in a direction orthogonal to the direction of running the first potential supply line and the second potential supply line.

By arranging them in this way, the space rule in view of layout between a source/drain region and a semiconductor region (well or a substrate) surrounding thereof is not unnecessarily adopted, connection among the pass transistor circuits and installation of an electricity feeding line to the source of the signal polarity inverting circuit can be conducted reasonably and therefore, as a result, the cell area can be reduced. Now, consider a case in which when the field effect transistor (110) constituting the pass transistor circuit is of the second type, the transistor is arranged not between the two transistors constituting the signal polarity inverting circuits but thereabove or therebelow. First, consider as case in which the transistor is arranged thereabove. This signifies that in the first place, transistors of a second type are arranged above and below a transistor of a first type and accordingly, semiconductor regions surrounding the transistor need to provide separately to the respective two transistors of the second type. Generally, a space rule on a layout between a source/drain region of a transistor and a semiconductor region (well or a substrate) surrounding thereof (now, this is referred to as a WELL-SD region space rule) becomes significantly larger than the minimum rule for the layout. Therefore, when arranged in this way, at least two of the WELL-SD regions are needed between the transistor constituting the pass transistor and the first type transistor of the signal polarity inverting circuit and further two of the WELL-SD region space rule are needed between the first type transistor of the signal polarity inverting circuit and the second transistor. Thereby, there poses a problem in which the size of the cell in the vertical direction is increased. Next, consider a case in which it is arranged therebelow. In this case, the second type transistor constituting the pass transistor circuit and the second type transistor constituting the signal polarity inverting circuit can be realized in the same semiconductor region (well or a substrate) and accordingly, only two of the WELL-SD region space rule are needed between the first type transistor and the second type transistor of the signal polarity inverting circuit, which is more preferable than in the case of arranging it therebelow. However, in this case, a wiring for feeding electricity to the source of the second type transistor constituting the signal polarity inverting circuit (referred to as source electricity feeding wiring) needs to draw from the second potential supply line to above the transistor constituting the pass transistor circuit. However, when considering a case in which a plurality of pass transistor circuits are present and wire connection needs to carry out among them. In order to prevent the connected wiring (for example, 112 in FIG. 1) from being intersected with the above-described source electricity feeding wiring (for example, 113 of FIG. 1), the wire connection needs to carry out among the pass transistor circuits by drawing the wiring above the second type transistor constituting the signal polarity inverting circuit or either of the two wirings needs to connect in a wiring layer at one upper layer. In the former case, the wiring needs to draw significantly and therefore, the wiring is difficult and the cell area is increased. Further, in the latter case, generally, the wiring in an upper layer is used in wiring outside of the cell and accordingly, when the wiring is used at inside of the cell, the degree of freedom of wiring outside of the cell is significantly deteriorated and accordingly, it is not preferable as well. In the meantime, according to the above-described embodiment of the present invention, either of these problems can be resolved and accordingly, the embodiment is preferable.

When a further detailed explanation is given to the output signal amplifier in the logical operation circuit in reference to FIG. 1, there is provided a circuit comprising an input node, an output node, the first field effect transistor 104 of the first type, a drain/source path of which is connected between the output node and first potential and a gate of which responds to the input node, the second field effect transistor 105 of the second type, a drain/source path of which is connected between the output node and the second potential and a gate of which responds to the input node and a third field effect transistor 114 of the first type, a drain/source path of which is connected between the input node and first potential and a gate of which responds to the output node. According to the output signal amplifier, wire connection from a drain of the third field effect transistor to the gates of the first field effect transistor and the second field effect transistor, is carried out by 115 passing below the first potential supply line by using a gate material.

By using the gate material as wiring in this way, the lower side of the potential supply line can effectively be utilized and accordingly, there can be resolved a problem in which wiring operation becomes difficult when wiring at the vicinities of the first field effect transistor and the third field effect transistor of the output signal amplifier is crowded.

Figure 4:
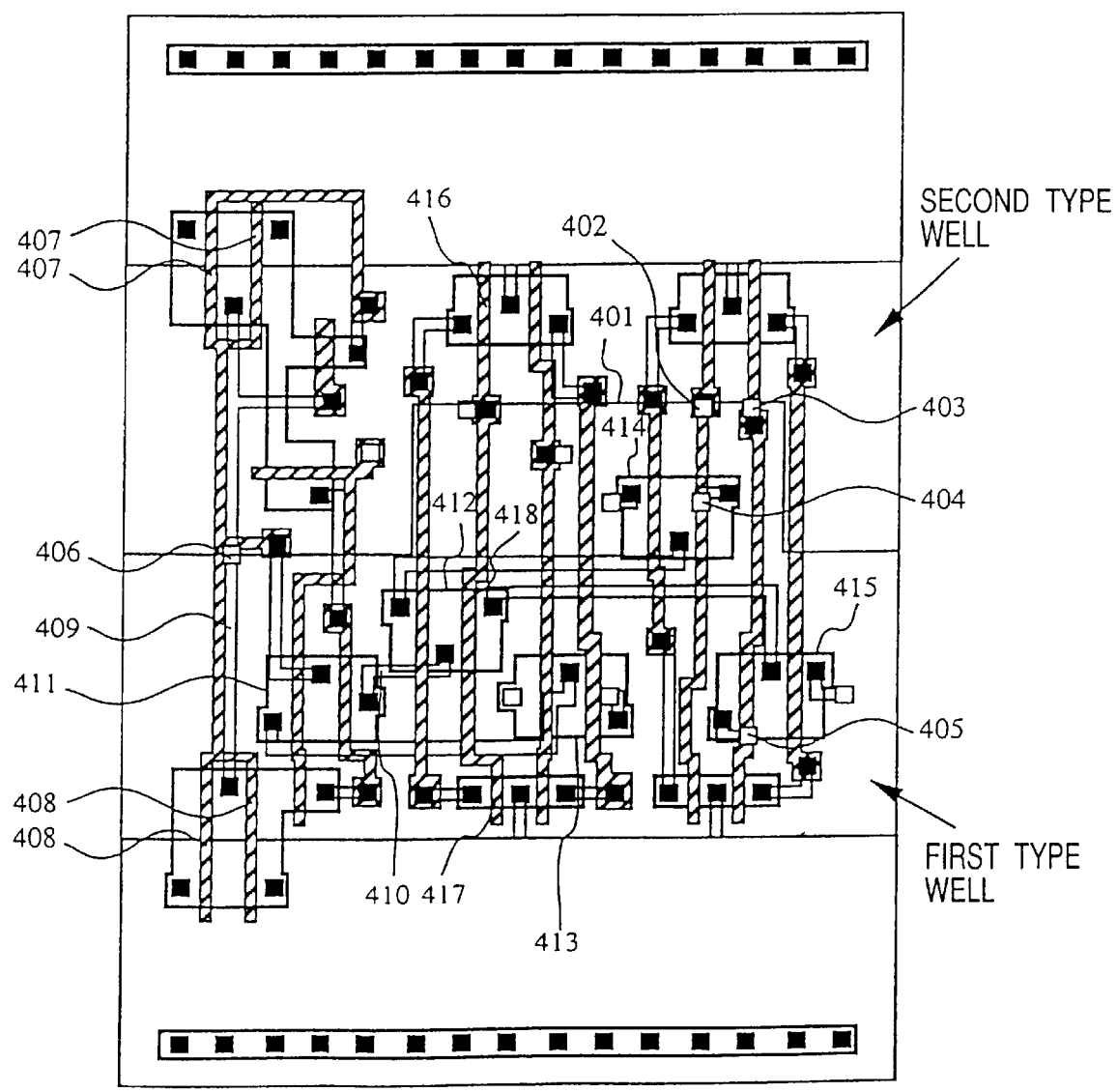
FIG. 4 is a layout diagram of a logical operation circuit cell according to an embodiment of the present invention.
Figure 5A:
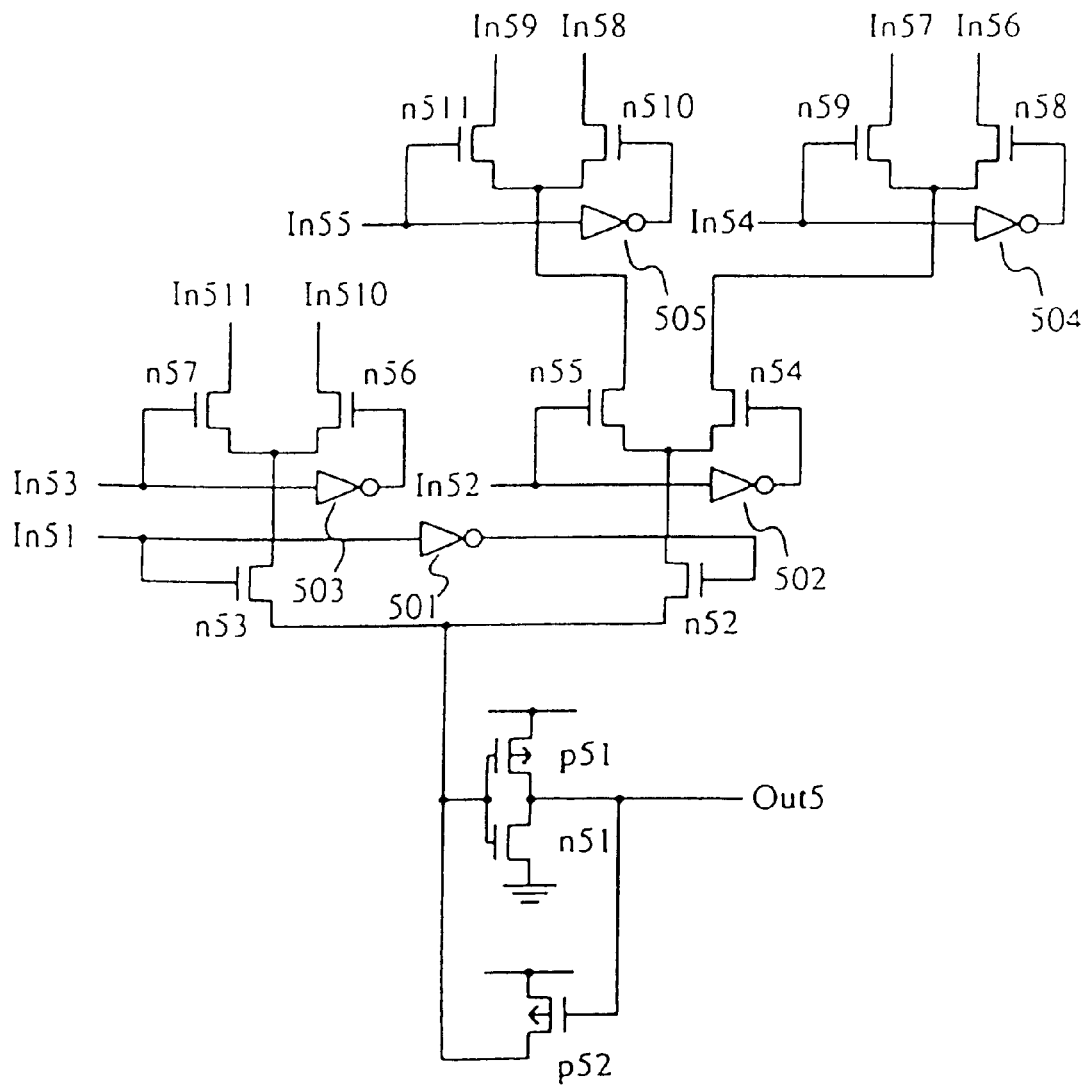
FIG. 5 is a circuit diagram of the logical operation circuit cell according to the embodiment of the present invention.
Figure 5B:
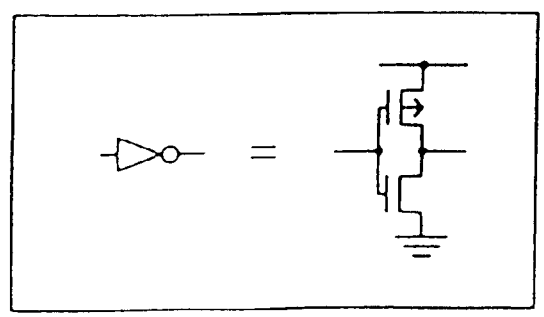

An explanation will be given of other embodiment of the present invention in reference to FIG. 4 and FIG. 5. FIG. 4 shows layout of a pass transistor logical operation circuit cell when five of pass transistor circuits are present for one output signal amplifier. FIG. 5 shows a circuit in correspondence with FIG. 4. First, correspondence between layout and circuits will be given.

Figure 6:
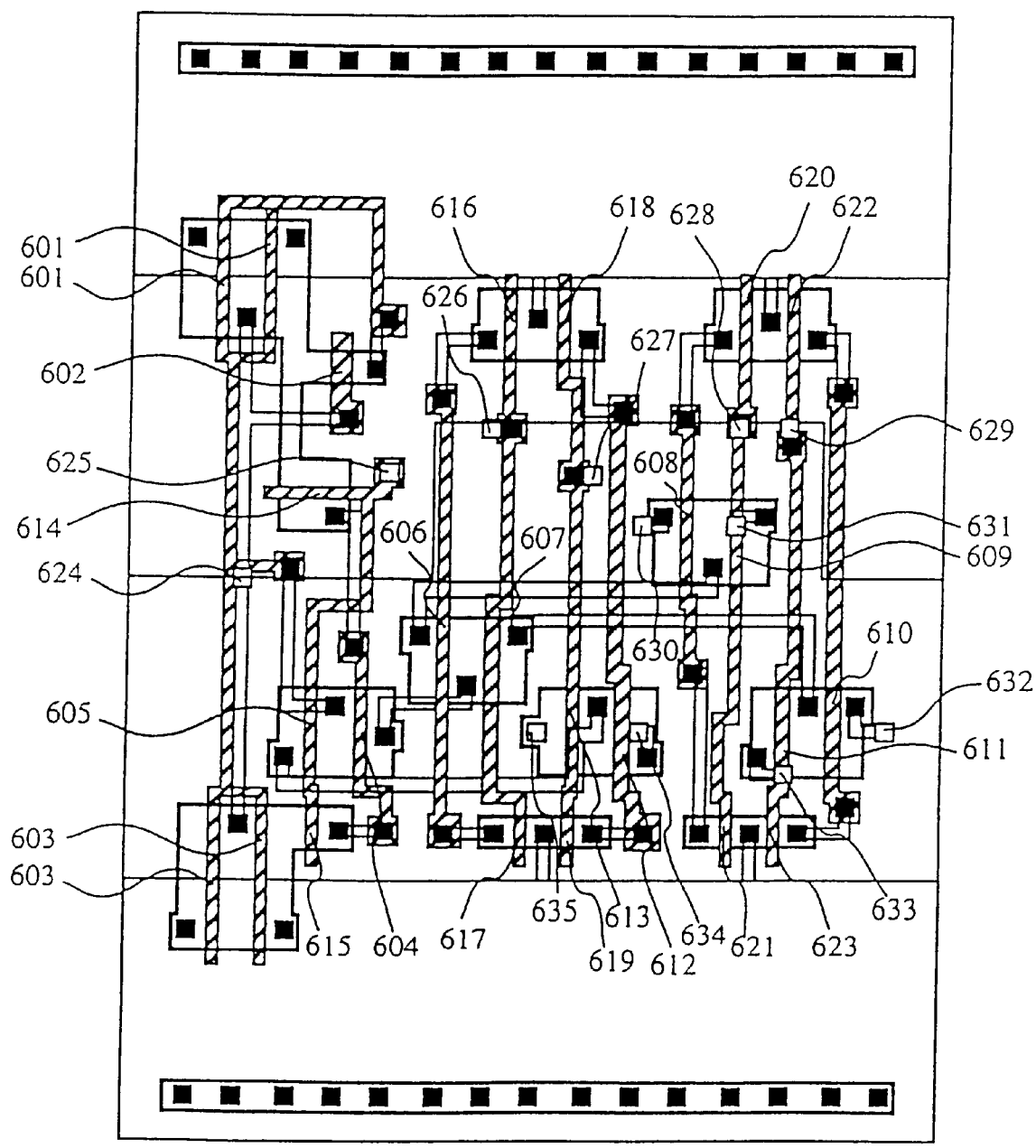
FIG. 6 is a layout diagram of the logical operation circuit cell according to the embodiment of the present invention.

Correspondence between FIG. 4 and FIG. 5 is shown by FIG. 6. Although layout of FIG. 6 is the same as that of FIG. 4, the layout shows transistors and input and output terminals along with numerals. Correspondence between these and transistors and input and output terminals of FIG. 5 is as follows.

p51 of FIG. 5 corresponds to 601 of FIG. 6, p52 of FIG. 5 corresponds to 602 of FIG. 6, n51 of FIG. 5 corresponds to 603 of FIG. 6, n52 of FIG. 5 corresponds to 604 of FIG. 6, n53 of FIG. 5 corresponds to 605 of FIG. 6, n54 of FIG.

Figure 7:
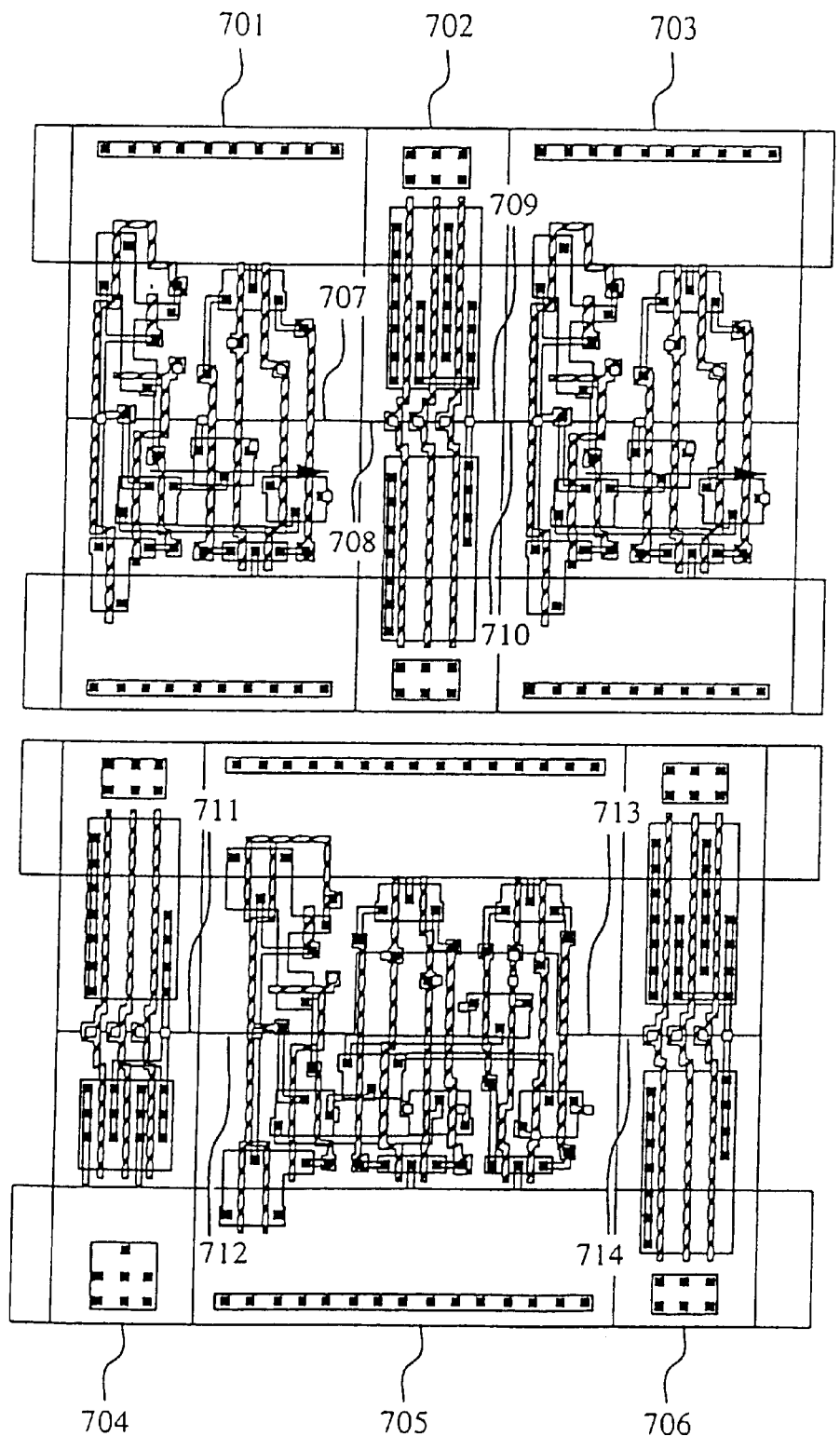
FIG. 7 is a layout diagram arranging a plurality of the logical operation circuit cells according to the embodiment of the present invention.

5 corresponds to 606 of FIG. 6, n55 of FIG. 5 corresponds to 607 of FIG. 6, n56 of FIG. 5 corresponds to 608 of FIG. 6, n57 of FIG. 5 corresponds to 609 of FIG. 6, n58 of FIG. 5 corresponds to 610 of FIG. 6, n59 of FIG. 5 corresponds to 611 of FIG. 6, n510 of FIG. 5 corresponds to 612 of FIG. 6, n511 of FIG. 5 corresponds to 613 of FIG. 6, 501 of FIG. 5 corresponds to 614 and 615 of FIG. 6, 502 of FIG. 5 corresponds to 616 and 617 of FIG. 6, 503 of FIG. 5 corresponds to 618 and 619 of FIG. 6, 504 of FIG. 5 corresponds to 620 and 621 of FIG. 6, 505 of FIG. 5 corresponds to 622 and 623 of FIG. 6, Out5 of FIG. 5 corresponds to 624 of FIG. 6, In51 of FIG. 5 corresponds to 625 of FIG. 6, In52 of FIG. 5 corresponds to 626 of FIG. 6, In53 of FIG. 5 corresponds to 627 of FIG. 7, In54 of FIG. 5 corresponds to 628 of FIG. 6, In55 of FIG. 5 corresponds to 629 of FIG. 6, In56 of FIG. 5 corresponds to 630 of FIG. 6, In57 of FIG. 5 corresponds to 631 of FIG. 6, In58 of FIG. 5 corresponds to 632 of FIG. 6, In59 of FIG. 5 corresponds to 633 of FIG. 6, In510 of FIG. 5 corresponds to 634 of FIG. 6 and In511 of FIG. 5 corresponds to 635 of FIG. 6.

According to the embodiment, there is provided a cell (FIG. 4, FIG. 5 and 705 of FIG. 7) comprising a logical operation circuit having at least one pass transistor circuit (PC51 of FIG. 5) and at least one output signal amplifier (BC51 of FIG. 5).

The pass transistor circuit (PC51, PC52, PC53 of FIG. 5) in the logical operation circuit includes a first input node, a second input node and a third input node, an output node, a field effect transistor of a first type or a second type (n52, n54, n56 of FIG. 5), a source/drain path of which is connected between the first node and the output node and a field effect transistor of the first type or the second type (n53, n55, 57 of FIG. 2), a source/drain path of which is connected between the second input node and the output node.

The output signal amplifier (BC51 of FIG. 5) in the logical operation circuit includes a circuit comprising an input node, an output node, a field effect transistor of a first type (p51 of FIG. 5), a drain/source path of which is connected between the output node and first potential and a gate of which responds to the input node and a field effect transistor of a second type (n51 of FIG. 5), a drain/source path of which is connected between the output node and the second potential and a gate of which responds to the input node.

The output node of the pass transistor circuit is connected to the input of the output signal amplifier. In this case, each cell is assumed to arrange contiguous to a CMOS logical operation circuit cell constituting a logic by connecting a first type field effect transistor and a second type field effect transistor in a complementary relationship (refer to arrangement of 704 and 705 of FIG. 7 explained below).

A boundary (referred to as well boundary) between a semiconductor region of a second type (referred to as second well) surrounding a field effect transistor of a first type constituting the transistor logical operation circuit and a semiconductor region of a first type (referred to as first well) surrounding a field effect transistor of a second type, is brought into a first semiconductor side or a second semiconductor side at inside of the cell (401 of FIG. 4) and is arranged nonlinearly at inside of the cell.

According to the above-described semiconductor integrated circuit in accordance with the embodiment of the present invention, a region of a field effect transistor constituting a pass transistor circuit can effectively be provided at inside of the cell. That is, according to a CMOS logical operation circuit cell, normally, a transistor of a first type and a transistor of a second type are brought into a complementary relationship and numbers of these coincide with each other. Accordingly, transistors having the same numbers can respectively be laid out with no problem on both sides of a well boundary drawn linearly. However, in the case of a pass transistor logical operation circuit cell, a number of transistors of a type the same as that of transistors constituting the pass transistor circuit becomes larger than a number of transistors having a type different therefrom. Meanwhile, when the cell boundary is laid out linearly even at inside of the cell to be linearly connected to the CMOS logical operation circuit cell having a contiguous boundary, even if there is constituted a distribution ratio of a first well and a second well suitable for the CMOS logical operation circuit cell, it becomes a distribution ratio which is not suitable for the pass transistor logical operation circuit cell in which one type of transistors are more than other type of transistors. However, when the above-described embodiment of the present invention is used, there is provided a wide region for transistors constituting the pass transistor circuit at inside of the cell and accordingly, a difference in the number of transistors can successively be realized.

Figure 10A:
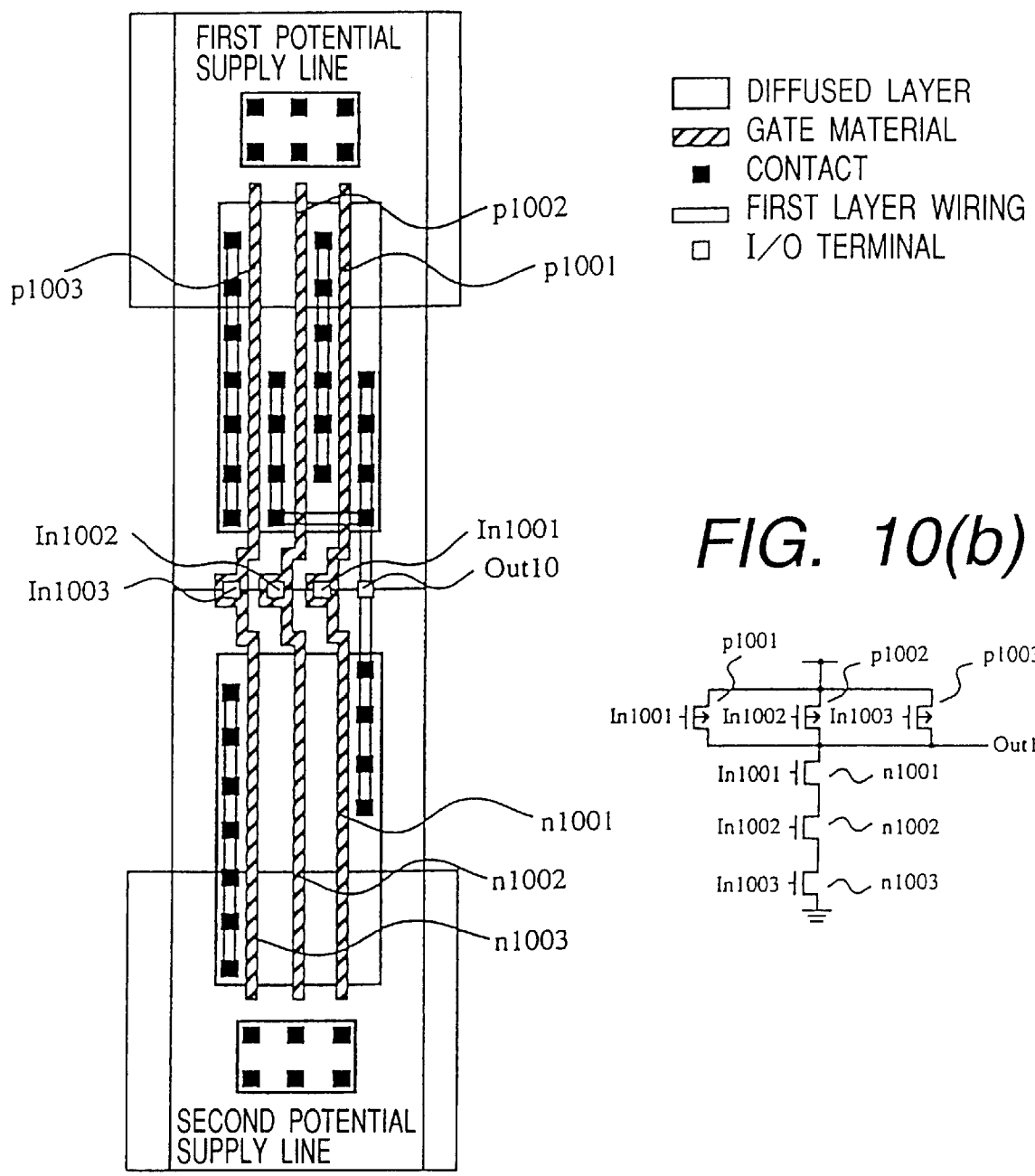
FIG. 10 is a layout diagram of a conventional CMOS logical operation circuit (3 inputs NAND).
Figure 10B:
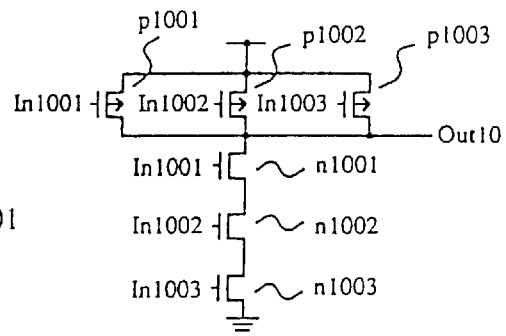
Figure 11A:
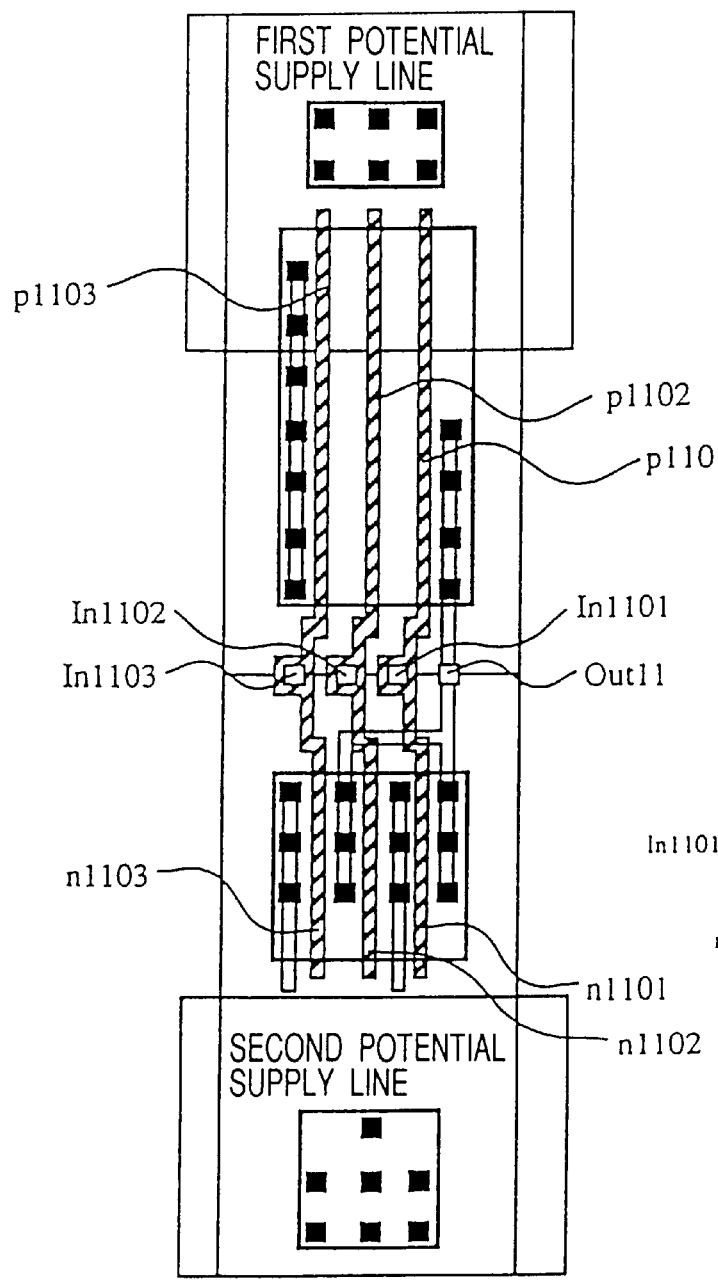
FIG. 11 is a layout diagram of a conventional CMOS logical operation circuit (3 inputs NOR).
Figure 11B:
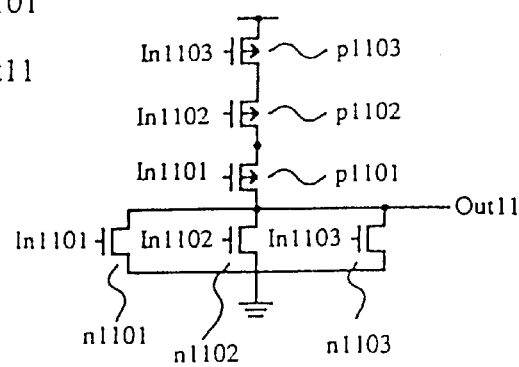

According to the layout of the cell of the embodiment (FIG. 4), the input and output terminals (402 through 406) are not arranged to include the same terminal grid coordinates in respect of the vertical direction of the drawings. According to the CMOS logical operation circuit cell, even when all of inputs and outputs include the same terminal grid coordinates in the vertical direction (terminal grid coordinates in the horizontal direction may naturally differ), there poses no problem since a number of input and output terminals per cell is small (refer to FIG. 10), however, in the case of the pass transistor logical operation circuit cell, a number of input and output terminals per cell is larger than that of the CMOS logical operation circuit cell which poses a problem. Now, when four terminals of the input terminals 402, 403, 404 and 405 are used to arrange to include the same terminal grid coordinates in respect of the vertical direction of the drawing, a space rule at least prescribed by a design rule of a wiring layer surrounding the terminals, is needed among them and therefore, at least three of the space rules are needed in the horizontal direction. However, when there are set terminal grid coordinates which are different in the vertical direction as in 402 and 404 and 403 and 405 as in the embodiment, in arranging four of these input terminals, only one of the above-described space rule is sufficient. Accordingly, the cell size in the horizontal direction can be reduced.

Further, according to the semiconductor integrated circuit of the embodiment, the input terminal (404, 405 of FIG. 4) to the source/drain region of the transistor constituting the pass transistor circuit is arranged on the lower side of the drawing than the input terminal (402, 403 of FIG. 4) to the gate. By arranging in this way, a wiring drawn from the source/drain of the transistor constituting the pass transistor circuit and a wiring drawn from the gate do not intersect with each other and can reasonably be laid out and therefore, the cell area can be reduced.

Further, according to the semiconductor integrated circuit of the embodiment, the output signal amplifier (407 and 408 of FIG. 4) is arranged at an end of the cell (in respect of the horizontal direction). In the case of the embodiment in which five of the pass transistor circuits are present in respect of the single cell, as shown by the circuit of FIG. 5, wire connection among the five pass transistors is increased. In such a case, when the output signal amplifier is not arranged at an end of the cell but is arranged at the center of the cell, or arranged within a portion where the five pass transistor circuits are arranged, a wiring (409) in the output signal amplifier and a wiring (410) between the pass transistor circuits, are liable to intersect with each other and the wiring operation becomes difficult. However, it is known that according to the embodiment, such a problem is avoided.

Further, according to the semiconductor integrated circuit of the embodiment, the output signal amplifier is arranged at a right end and five of the pass transistor circuits are arranged to develop on a right side thereof (411, 412, 413, 414, 415) In considering this case in view of the case of FIG. 1 where three of the pass transistor circuits are present, it is known that while substantially a similar arrangement is provided to the output signal amplifier on the left side and the three pass transistor circuits are arranged to the right, two pass transistor circuits are further added to the right. By constituting such an arrangement, even when a plurality of the pass transistor circuits are present, in view of layout, additional portions may be laid out to a cell having pass transistor circuits of a smaller number. Accordingly, a time period required for the cell layout can significantly be reduced.

Further, according to the semiconductor integrated circuit of the embodiment, a width of the source/drain region of the field effect transistor constituting the pass transistor circuit in the direction of running a supply line of the first potential and a supply line of the second potential (for example, source/drain region on the left side of 412), is changed depending on locations in the same source/drain region. Thereby, the above source/drain region can be made contiguous to the source/drain region of a contiguous pass transistor circuit (a source/drain region on the right of 411) at a portion having no contact whereby a size in the running direction of the potential supply line is reduced.

Further, according to the semiconductor integrated circuit of the embodiment, as mentioned above, the boundary (well boundary, 401) between the semiconductor region (referred to as a second type well) surrounding the first type of the transistor and the semiconductor region (referred to as a first type well) surrounding the second type of the transistor, is bent to break nonlinearly at inside of the cell. That is, in this case, a region of the first type well is larger than a region of the second type well. Now, according to the cell, there are seven of the first type transistors and twelve of the second type transistors and a number of the second type transistors is larger than that of the first type transistors. According to the embodiment of the present invention, by widening the first type well region, a region of laying out the second type transistors can widely be provided. Further, a boundary portion in respect with a contiguous cell coincides with a well boundary line provided to the CMOS logical cell and a rule for the minimum width of well in contiguously arranging a plurality of cells can be satisfied with no problem.

Further, according to the semiconductor integrated circuit of the embodiment, a signal polarity inverting circuit is inserted into the inside of the cell in pair with the pass transistor circuit. That is, in FIG. 4, there is at inside of the cell a signal polarity inverting circuit (constituted by 416 and 417) for forming a complementary signal to a gate of one transistor thereof. The advantage of constituting such a mode has already been described.

Further, according to the semiconductor integrated circuit of the embodiment, although the signal polarity inverting circuit is inserted into the cell in pair with the pass transistor circuit, a channel width of a transistor constituting the output signal amplifier is larger than a channel width of a transistor constituting the signal polarity inverting circuit. That is, in FIG. 4, with regard to the first type field effect transistor, the width of 407 is larger than that of 416 and with regard to the second type field effect transistor, the width of 408 is larger than that of 417. The advantage of constituting the mode has already been described.

Further, according to the semiconductor integrated circuit of the embodiment, the signal polarity inverting circuit is inserted into the cell in pair with the pass transistor circuit and a transistor (418) constituting the pass transistor circuit is arranged between the first type transistor (416) and the second type transistor (417) constituting the signal polarity inverting circuit. The advantage of constituting the mode has already been described.

An explanation will be given of other embodiment in reference to FIG. 7. In FIG. 7, there are provided cells 701, 703 and 705 comprising logical operation circuits each having at least one pass transistor circuit (for example, may be similar to circuits shown by PC21, PC22, PC23 of FIG. 2) and at least one output signal amplifier (for example, may be similar to the circuit shown by BC21 of FIG. 2). An output node of the pass transistor circuit is connected to the input of the output signal amplifier similar to the example of FIG. 2.

FIG. 7 shows a behavior of arranging the pass transistor logical operation circuit cells 701, 703 and 705 contiguous to generally used CMOS logical operation circuit cells. Portions of connecting wells 707, 710, 712 and 713 of the pass transistor logical operation circuit cells and well boundaries of the CMOS logical operation circuit cells 708, 709, 711 and 714 become linear.

As shown by FIG. 7, the cells 701 and 703 or the cell 705 are arranged contiguous to a CMOS logical operation circuit cell 702 or cells 704 and 706 each constituting a logic by connecting a first type of a field effect transistor and a second type of a field effect transistor in a complementary relationship. In this case, linear connection is realized at portions of connecting boundaries 708, 709, 711 and 714 of semiconductor regions of the second type surrounding the first type of the field effect transistor constituting the CMOS logical operation circuit and semiconductor regions of the first type surrounding the field effect transistor of the second type, and boundaries 707, 710, 712 and 713 (referred to as well boundaries) of semiconductor regions of the second type surrounding the first type of the field effect transistor constituting the pass transistor logical operation circuit and semiconductor regions of the first type surrounding the second type of the field effect transistor.

According to the example, when cells are contiguous to each other, the well boundaries are linearly connected and accordingly, even in the case in which a minimum width of a region surrounding a transistor prescribed by a design rule (referred to as rule for the minimum width of well) is not satisfied only by a single cell, the rule can be satisfied by contiguously arranging a plurality of the cells. Accordingly, as a result, the cell area can be reduced. When the embodiment according to the present invention is not used, in arranging contiguously a pass transistor logical operation circuit and a CMOS logical operation circuit cell in the same block on the same chip, design rule error is caused at a particular location (location where only one of a cell which cannot satisfy the above-described rule for the minimum width of well is isolatedly arranged). However, when the cell layout according to the present invention is carried out, the problem is resolved.

Figure 8:
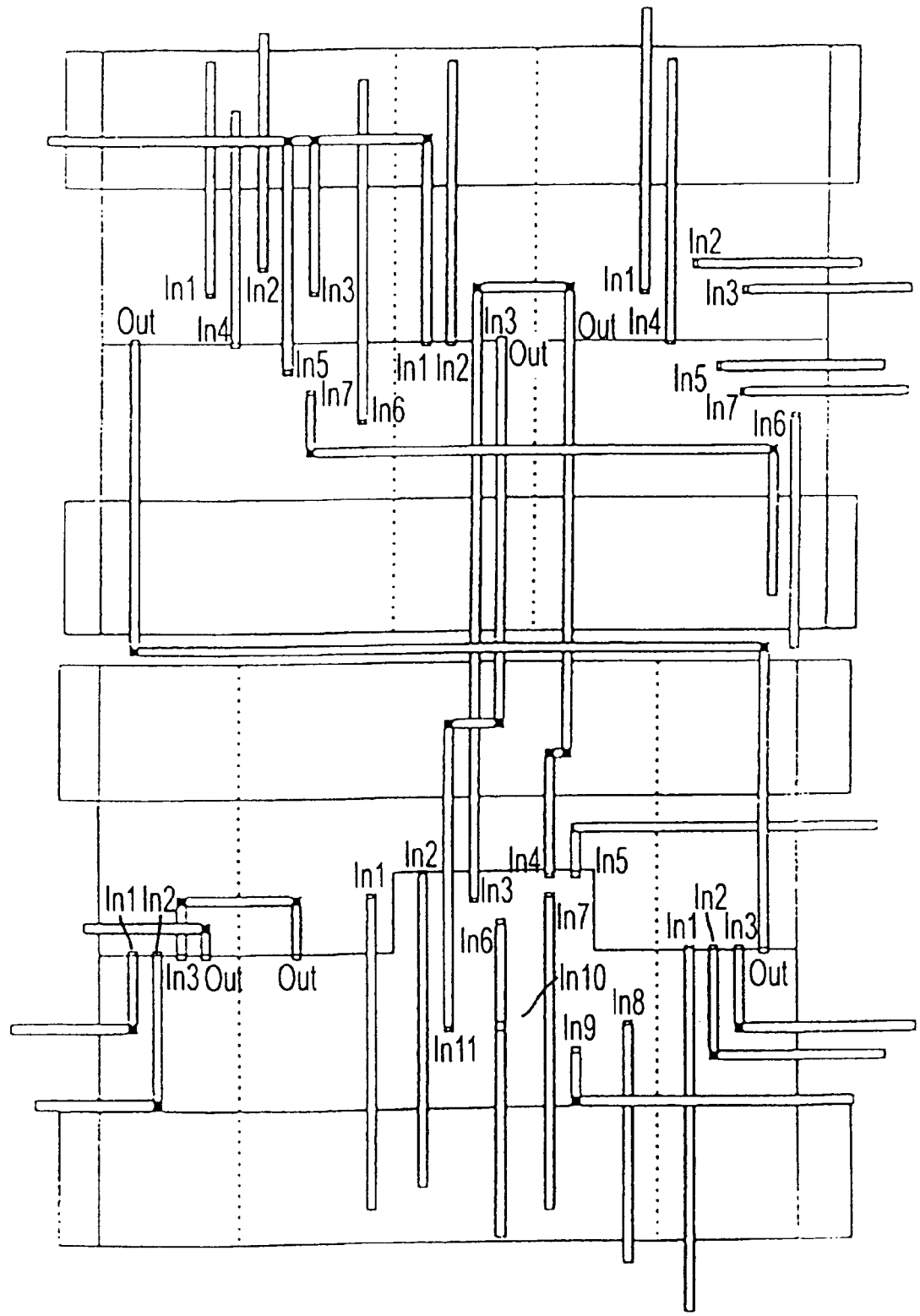
FIG. 8 is a layout diagram arranging and connecting a plurality of the logical operation circuit cells according to the embodiment of the present invention.

FIG. 8 shows a behavior in which the pass transistor logical operation circuit cells according to the present invention are arranged contiguous to generally used CMOS logical operation circuit cells and these cells are connected by using an upper layer of a wiring layer. An input is designated by In and an output is designated by Out. In the drawing, by overlapping four of cross portions on FIG. 7, illustrated above, a relationship between a lower layer and the upper layer becomes apparent. In this case, there is shown an example in which a second layer is used in wirings in the vertical direction and a third layer is used in wirings in the horizontal direction. In this case, while wirings of the CMOS logical operation circuit cells are drawn only in the vertical direction, in the case of the pass transistor logical operation circuit cells, the wirings are drawn in the horizontal direction.

Figure 9A:
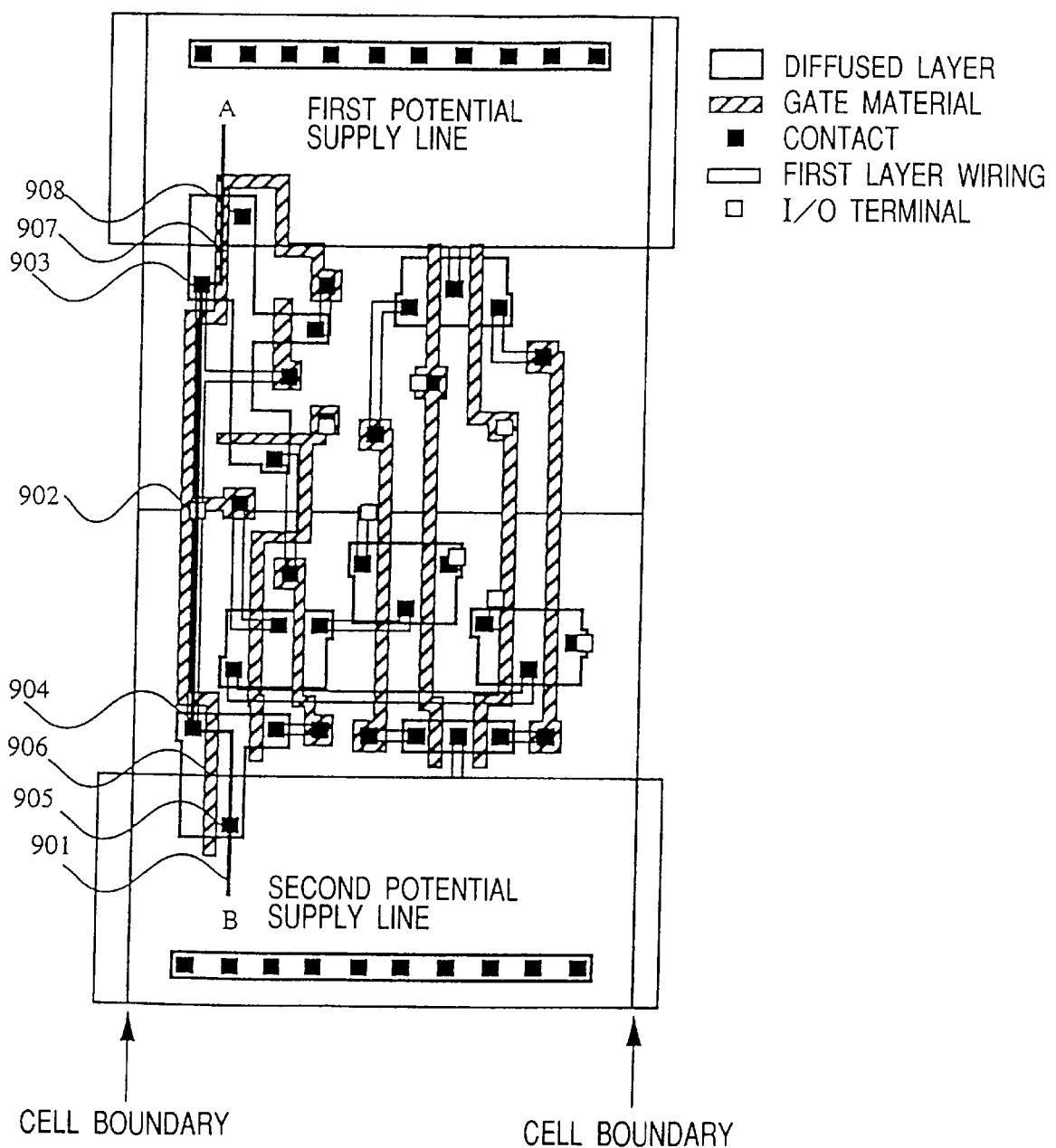
FIG. 9 illustrates sectional views of the logical operation circuit cell according to the embodiment of the present invention.
Figure 9B:
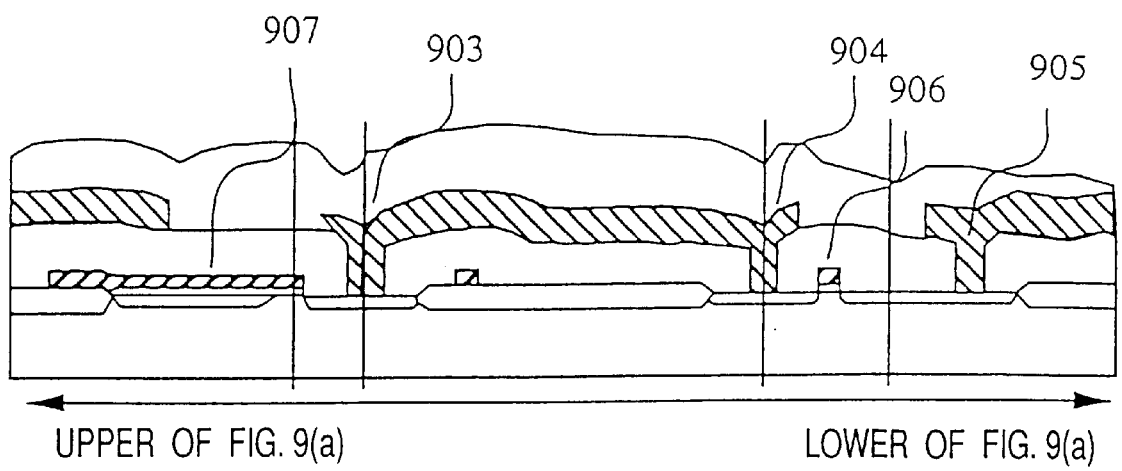
Figure 9C:
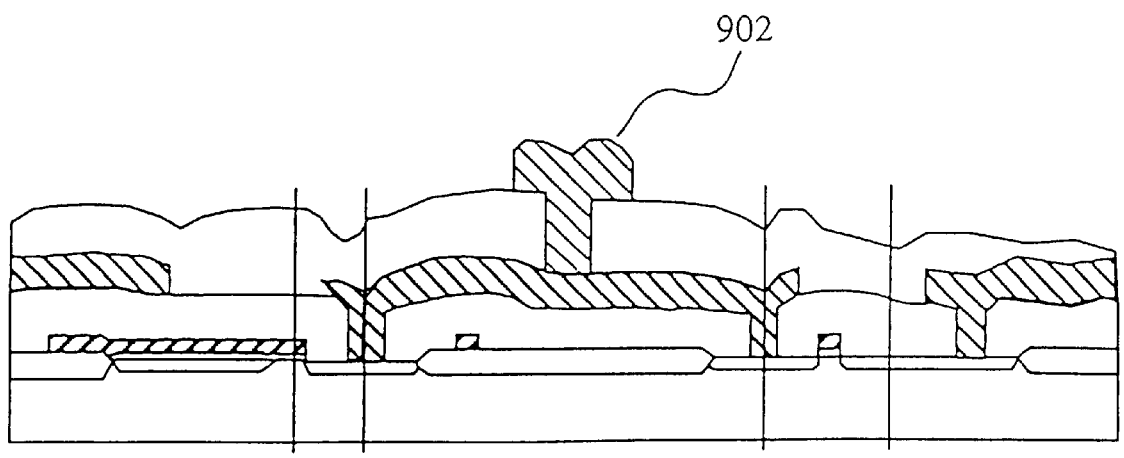

FIG. 9(a) shows a pass transistor logical operation circuit cell the same as that in FIG. 1. FIG. 9(b) and FIG. 9(c) schematically represent sectional views when the cell is cut along a line designated by 901. FIG. 9(b) shows a case in which a second layer of a wiring is not drawn to an output terminal 901 of FIG. 9(a) and FIG. 9(c) shows a case in which the wiring is drawn thereto. 903 of FIG. 9(c) shows drawing of a wiring at a second layer.

Figure 12:
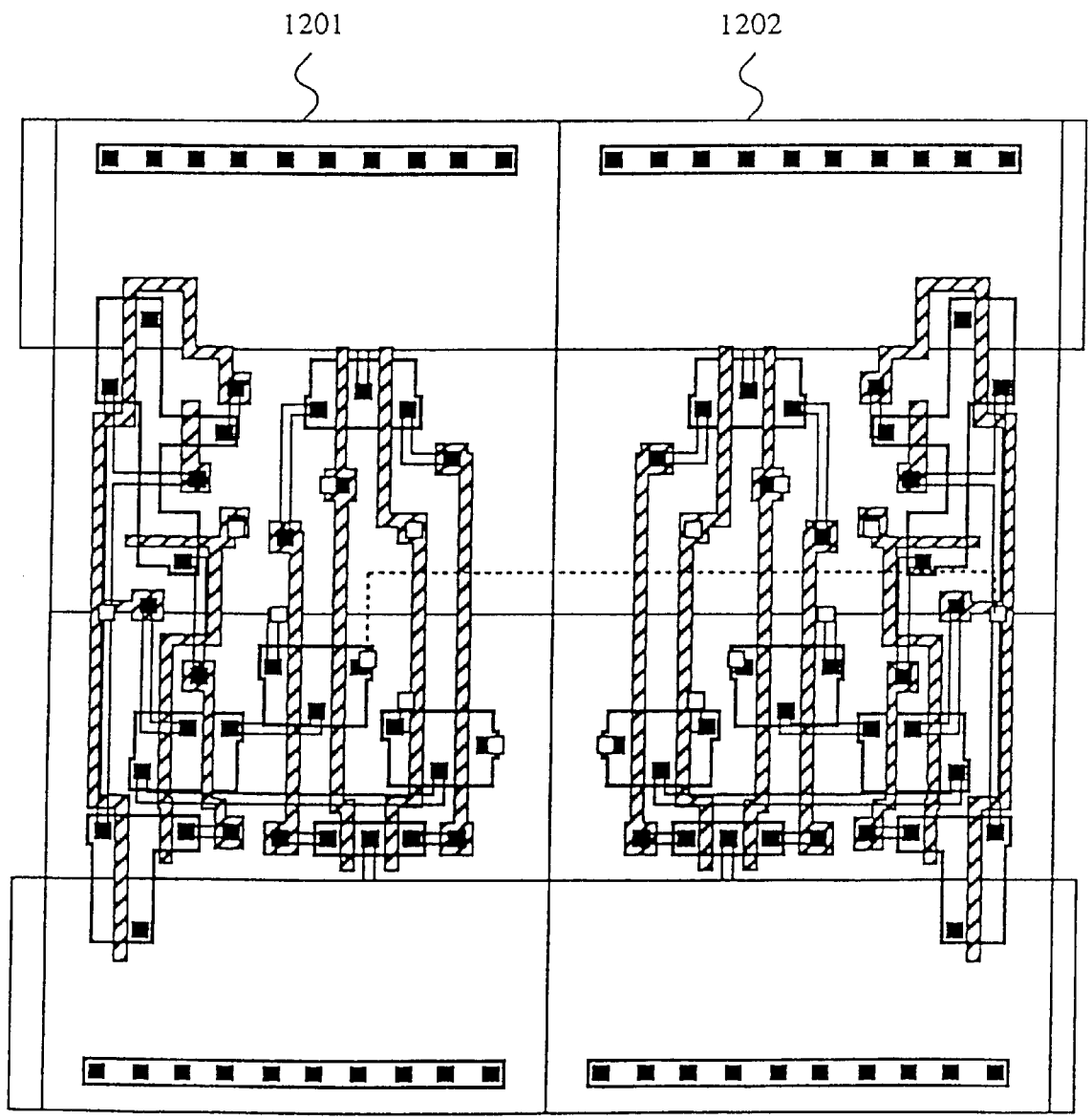
FIG. 12 is a layout diagram arranging the logical operation circuit cells according to the embodiment of the present invention by inverting the cells horizontally.

FIG. 12 shows a case in which a pass transistor logical operation circuit cell 1201 and 1202 where the pass transistor logical operation circuit cell 1201 is inverted in the horizontal direction, are contiguously arranged and connected. Although according to the embodiment, 1202 is produced by inverting 1201 in the horizontal direction, a cell to be inverted may naturally be other pass transistor logical operation circuit cell or a CMOS operation circuit cell.

Figure 13:
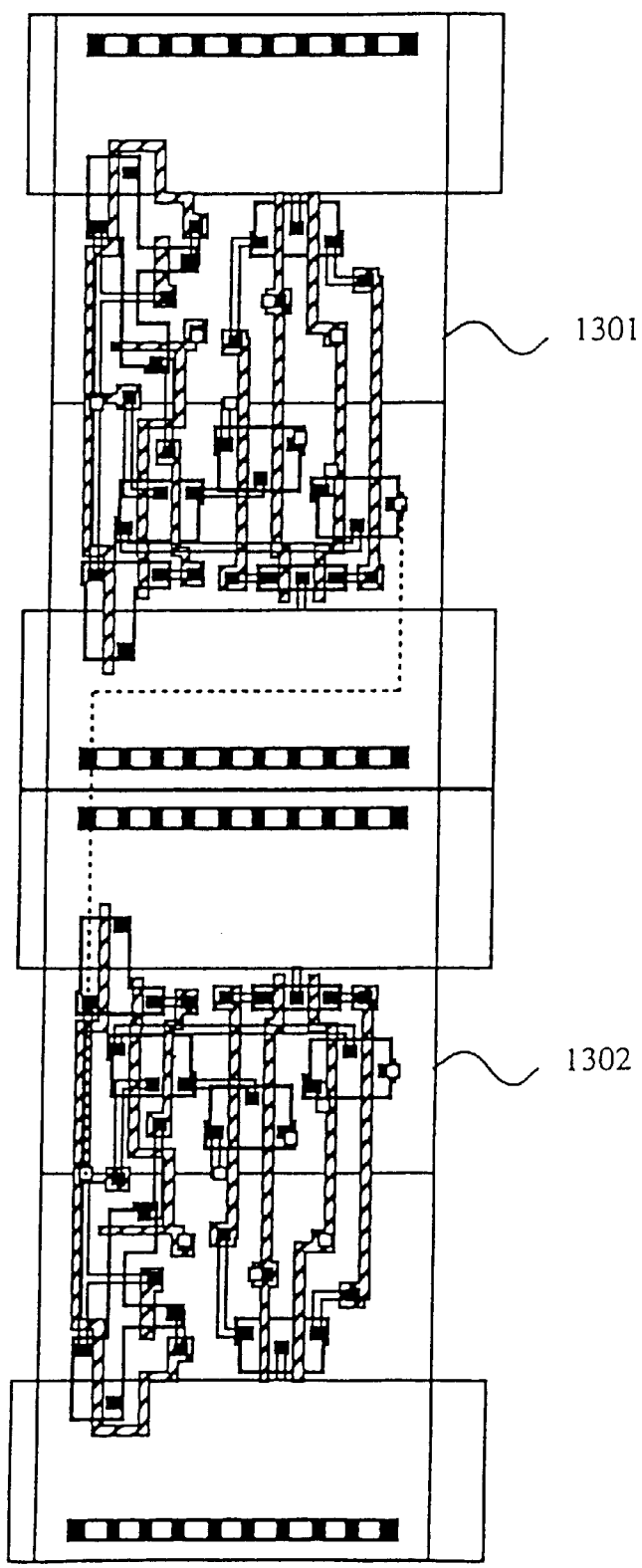
FIG. 13 is a layout diagram arranging the logical operation circuit cells according to the embodiment of the present invention by inverting the cells vertically.

FIG. 13 shows a case in which a pass transistor logical operation circuit cell 1301 and 1302 produced by inverting the pass transistor logical operation circuit cell in the vertical direction, are contiguously arranged and connected. Although according to the embodiment, 1302 is produced by inverting 1301 in the vertical direction, a cell to be inverted may naturally be other pass transistor logical operation circuit cell or a CMOS logical operation circuit cell.

Figure 14:
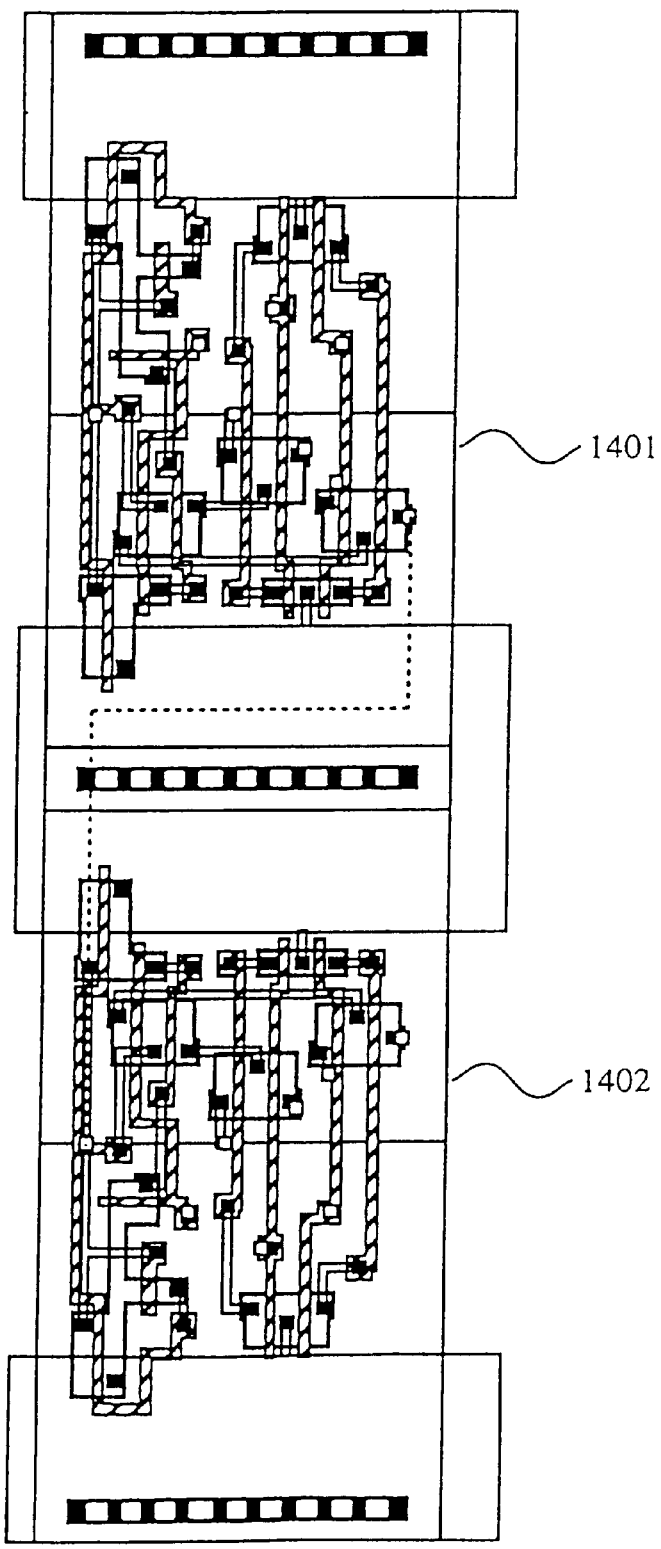
FIG. 14 is a layout diagram arranging logical operation circuit cells according to the embodiment of the present invention by inverting the cells vertically.

FIG. 14 shows a case in which a pass transistor logical operation circuit cell 1401 and 1402 produced by inverting the pass transistor logical operation circuit cell in the vertical direction, are contiguously arranged and connected. However, what differs from the embodiment of FIG. 13 resides in arranging to overlap electricity feeding portions for latch up measure to semiconductor regions (well) surrounding transistors of upper and lower two cells simultaneous with the vertical inversion. In this way, there is achieved an advantage of capable of making the cell area smaller than that in the case of FIG. 13.

Although a detailed explanation has been given of the embodiments according to the present invention which have been carried out by the inventors, the present invention is not limited to the above-described specific embodiments but may naturally be modified variously within the range of the technical thought.

For example, the field effect transistor of the pass transistor circuit is not limited to MOSFET of silicon but MOSFET by a compound semiconductor of GaAs can be used.

Further, the logical operation circuit having the pass transistor circuit according to the present invention naturally achieves effects in a reduction in a layout area, a reduction in a wiring amount and reductions in power consumption and a delay time period accompanied thereby by being applied to a random logic circuit for decoding an instruction of an RISC type and controlling an instruction executing unit in LSI of a general use processor, a signal processing processor, an image processing processor or the like.

INDUSTRIAL APPLICABILITY

According to the present invention, there can be provided a semiconductor integrated circuit having a pass transistor logical operation circuit cell having a small area and capable of reducing power consumption and delay.

What is claimed is:

1. A semiconductor integrated circuit characterized in that in a semiconductor integrated circuit having a cell comprising a logical operation circuit including at least one pass transistor circuit and at least one output signal amplifier:

wherein the pass transistor circuit in the logical operation circuit includes a first input node, a second input node and a third input node, a pass transistor output node, a first field effect transistor of a first type or a second type, a source/drain path of which is connected between the first input node and the pass transistor output node and a second field effect transistor of the first type or the second type, a source/drain path of which is connected between the second input node and the output node;

wherein the output signal amplifier in the logical operation circuit includes a circuit comprising an input node, an output node, a field effect transistor of the first type, a drain/source path of which is connected between the output node and first potential and a gate of which responds to the input node of the output signal amplifier and a field effect transistor of the second type, a drain/source path of which is connected between the output node of the output signal amplifier and second potential and a gate of which responds to the input node;

wherein the output node of the pass transistor circuit is connected to the input of the output signal amplifier;

wherein the third input node of the pass transistor circuit is applied with an input signal from outside of the cell;

wherein at least two of all of the first input node and the second input node of the pass transistor circuit are applied with input signals from outside of the cell;

wherein the output node of the output signal amplifier operates to output an output signal to outside of the cell; and wherein when a coordinate system is determined in a direction of running a supply line of the first potential and a supply line of the second potential and a direction orthogonal thereto, respective terminals by a conductor layer for drawing the input signals from outside of the cell and the output signal to outside of the cell are arranged to include terminal grid points disposed at constant intervals in the coordinate system and grid coordinates of at least one of the respective terminals differ from grid coordinates arranged with at least two or more of the terminals other than the at least one terminal.

2. A semiconductor integrated circuit characterized in that in a semiconductor integrated circuit having a cell comprising a logical operation circuit including at least one pass transistor circuit and at least one output signal amplifier:

wherein the pass transistor circuit in the logical operation circuit includes a first input node, a second input node and a third input node, an output node, a first field effect transistor of a first type or a second type, a source/drain path of which is connected between the first input node and the output node and a second field effect transistor of the first type or the second type, a source/drain path of which is connected between the second input node and the output node;

wherein the output signal amplifier in the logical operation circuit includes a circuit comprising an input node, an output node, a field effect transistor of the first type, a drain/source path of which is connected between the output node and first potential and a gate of which responds to the input node and a field effect transistor of the second type, a drain/source path of which is connected between the output node and second potential and a gate of which responds to the input node;

wherein the output node of the pass transistor circuit is connected to the input of the output signal amplifier;

wherein the third input node of the pass transistor circuit is applied with an input signal from outside of the cell;

wherein at least two of all of the first input node and the second input node of the pass transistor circuit are applied with input signals from outside of the cell;

wherein the output node of the output signal amplifier operates to output an output signal to outside of the cell; and wherein when a coordinate system is determined in a direction of running a supply line of the first potential and a supply line of the second potential and a direction orthogonal thereto, a terminal from outside of the cell for inputting an input signal applied to the third input node of the pass transistor circuit is arranged to shift to a larger side or a smaller side of the coordinate system rather than terminals from outside of the cell for inputting input signals applied to the first input node and the second input node of the pass transistor circuit.

3. A semiconductor integrated circuit characterized in that in a semiconductor integrated circuit having a cell comprising a logical operation circuit including at least one pass transistor circuit and at least one output signal amplifier:

wherein the pass transistor circuit in the logical operation circuit includes a first input node, a second input node and a third input node, an output node, a first field effect transistor of a first type or a second type, a source/drain path of which is connected between the first input node and the output node and a second field effect transistor of the first type or the second type, a source/drain path of which is connected between the second input node and the output node;

wherein the output signal amplifier in the logical operation circuit includes a circuit comprising an input node, an output node, a field effect transistor of the first type, a drain/source path of which is connected between the output node and first potential and a gate of which responds to the input node and a field effect transistor of the second type, a drain/source path of which is connected between the output node and second potential and a gate of which responds to the input node;

wherein the output node of the pass transistor circuit is connected to the input of the output signal amplifier; and wherein when a coordinate system is determined in a direction of running a supply line of the first potential and a supply line of the second potential, the two types of the field effect transistors constituting the output signal amplifier are arranged to at least one of a cell boundary on a side having smallest coordinate values or a cell boundary on a side having largest coordinate values.

4. A semiconductor integrated circuit characterized in that in a semiconductor integrated circuit having a cell comprising a logical operation circuit including at least one pass transistor circuit and at least one output signal amplifier:

wherein the pass transistor circuit in the logical operation circuit includes a first input node, a second input node and a third input node, an output node, a first field effect transistor of a first type or a second type, a source/drain path of which is connected between the first input node and the output node and a second field effect transistor of the first type or the second type, a source/drain path of which is connected between the second input node and the output node;

wherein the output signal amplifier in the logical operation circuit includes a circuit comprising an input node, an output node, a field effect transistor of the first type, a drain/source path of which is connected between the output node and first potential and a gate of which responds to the input node and a field effect transistor of the second type, a drain/source path of which is connected between the output node and second potential and a gate of which responds to the input node;

wherein the output node of the pass transistor circuit is connected to the input of the output signal amplifier;

wherein the third input node of the pass transistor circuit is applied with an input signal from outside of the cell;

wherein at least two of all of the first input node and the second input node of the pass transistor circuit are applied with input signals from outside of the cell;

wherein the output node of the output signal amplifier operates to output an output signal to outside of the cell; and wherein a plurality of the pass transistor circuits are provided in the cell and the pass transistor circuits are developed to arrange in a direction of running a supply line of the first potential and a supply line of the second potential.

5. A semiconductor integrated circuit characterized in that in a semiconductor integrated circuit having a cell comprising a logical operation circuit including at least one pass transistor circuit and at least one output signal amplifier:

wherein the pass transistor circuit in the logical operation circuit includes a first input node, a second input node and a third input node, an output node, a first field effect transistor of a first type or a second type, a source/drain path of which is connected between the first input node and the output node and a second field effect transistor of the first type or the second type, a source/drain path of which is connected between the second input node and the output node;

wherein the output signal amplifier in the logical operation circuit includes a circuit comprising an input node, an output node, a field effect transistor of the first type, a drain/source path of which is connected between the output node and first potential and a gate of which responds to the input node and a field effect transistor of the second type, a drain/source path of which is connected between the output node and second potential and a gate of which responds to the input node;

wherein the output node of the pass transistor circuit is connected to the input of the output signal amplifier;

wherein the third input node of the pass transistor circuit is applied with an input signal from outside of the cell;

wherein at least two of all of the first input node and the second input node of the pass transistor circuit are applied with input signals from outside of the cell;

wherein the output node of the output signal amplifier operates to output an output signal to outside of the cell; and wherein a plurality of the pass transistor circuits are present at inside of the cell and a width of a source/drain region of the field effect transistor constituting the pass transistor circuit in a direction of running a supply line of the first potential and a supply line of the second potential is changed depending on locations in the same source/drain region.

6. A semiconductor integrated circuit characterized in that in a semiconductor integrated circuit having a cell comprising a pass transistor logical operation circuit including at least one pass transistor circuit and at least one output signal amplifier:

wherein the pass transistor circuit in the pass transistor logical operation circuit includes a first input node, a second input node and a third input node, an output node, a first field effect transistor of a first type or a second type, a source/drain path of which is connected between the first input node and the output node and a second field effect transistor of the first type or the second type, a source/drain path of which is connected between the second input node and the output node;

wherein the output signal amplifier in the logical operation circuit includes a circuit comprising an input node, an output node, a field effect transistor of the first type, a drain/source path of which is connected between the output node and first potential and a gate of which responds to the input node and a field effect transistor of the second type, a drain/source path of which is connected between the output node and second potential and a gate of which responds to the input node;

wherein the output node of the pass transistor circuit is connected to the input of the output signal amplifier; and wherein assuming that the cell is arranged contiguous to a CMOS logical operation circuit cell constituting a logic by connecting a field effect transistor of the first type and a field effect transistor of the second type in a complementary relationship, a boundary between a semiconductor region of the second type surrounding the field effect transistor of the first type constituting the CMOS logical operation circuit and a semiconductor region of the first type surrounding the field effect transistor of the second type and a boundary between a semiconductor region of the second type surrounding the field effect transistor of the first type constituting the pass transistor logical operation circuit and a semiconductor region of the first type surrounding the field effect transistor of the second type, are realized to connect linearly at a portion connecting thereof.

7. A semiconductor integrated circuit characterized in that in a semiconductor integrated circuit having a cell comprising a pass transistor logical operation circuit including at least one pass transistor circuit and at least one output signal amplifier:

wherein the pass transistor circuit in the pass transistor logical operation circuit includes a first input node, a second input node and a third input node, an output node, a first field effect transistor of a first type or a second type, a source/drain path of which is connected between the first input node and the output node and a second field effect transistor of the first type or the second type, a source/drain path of which is connected between the second input node and the output node;

wherein the output signal amplifier in the logical operation circuit includes a circuit comprising an input node, an output node, a field effect transistor of the first type, a drain/source path of which is connected between the output node and first potential and a gate of which responds to the input node and a field effect transistor of the second type, a drain/source path of which is connected between the output node and second potential and a gate of which responds to the input node;

wherein the output node of the pass transistor circuit is connected to the input of the output signal amplifier; and wherein assuming that the cell is arranged contiguous to a CMOS logical operation circuit cell constituting a logic by connecting a field effect transistor of the first type and a field effect transistor of the second type in a complementary relationship, a boundary between a semiconductor region of the second type surrounding the field effect transistor of the first type constituting the pass transistor logical operation circuit and a semiconductor region of the first type surrounding the field effect transistor of the second type, is brought to a side of the first semiconductor or a side of the second semiconductor and arranged to be nonlinear at inside of the cell.

8. A semiconductor integrated circuit characterized in that in a semiconductor integrated circuit including a cell comprising a pass transistor logical operation circuit having a pair of at least one set of pass transistor circuits and signal polarity inverting circuits and at least one output signal amplifier:

wherein the pass transistor circuit in the logical operation circuit includes a first input node, a second input node and a third input node, an output node, a field effect transistor of a first type or a second type, a source/drain path of which is connected between the first input node and the output node and a field effect transistor of the first type or the second type, a source/drain path of which is connected between the second input node and the output node;

wherein the signal polarity inverting circuit in the logical operation circuit includes a circuit comprising an input node, an output node, a field effect transistor of the first type, a drain/source path of which is connected between the output node and first potential and a gate of which responds to the input node and a field effect transistor of a second type, a drain/source path of which is connected between the output node and second potential and a gate of which responds to the input node;

wherein the output signal amplifier in the logical operation circuit includes a circuit comprising an input node, an output node, a field effect transistor of the first type, a drain/source path of which is connected between the output node and the first potential and a gate of which responds to the input node and a field effect transistor of the second type, a drain/source path of which is connected between the output node and the second potential and a gate of which responds to the input node;

wherein the output node of the pass transistor circuit is connected to the input of the output signal amplifier;

wherein the field effect transistor of the first type constituting the output signal amplifier is provided with a gate width larger than a gate width of the field effect transistor of the first type constituting the signal polarity inverting circuit; and wherein the field effect transistor of the second type constituting the output signal amplifier is provided with a gate width larger than a gate width of the field effect transistor of the second type constituting the signal polarity inverting circuit.

9. A semiconductor integrated circuit characterized in that in a semiconductor integrated circuit including a cell comprising a pass transistor logical operation circuit having a pair of at least one set of pass transistor circuits and signal polarity inverting circuits and at least one output signal amplifier:

wherein the pass transistor circuit in the logical operation circuit includes a first input node, a second input node and a third input node, an output node, a field effect transistor of a first type or a second type, a source/drain path of which is connected between the first input node and the output node and a field effect transistor of the first type or the second type, a source/drain path of which is connected between the second input node and the output node;

wherein the signal polarity inverting circuit in the logical operation circuit includes a circuit comprising an input node, an output node, a field effect transistor of the first type, a drain/source path of which is connected between the output node and first potential and a gate of which responds to the input node and a field effect transistor of a second type, a drain/source path of which is connected between the output node and second potential and a gate of which responds to the input node;

wherein the output signal amplifier in the logical operation circuit includes a circuit comprising an input node, an output node, a field effect transistor of the first type, a drain/source path of which is connected between the output node and the first potential and a gate of which responds to the input node and a field effect transistor of the second type, a drain/source path of which is connected between the output node and the second potential and a gate of which responds to the input node;

wherein the output node of the pass transistor circuit is connected to the input of the output signal amplifier;

wherein the field effect transistor constituting the pass transistor circuit is arranged between the first type and the second type of the field effect transistors constituting the signal polarity inverting circuit in respect of a direction orthogonal to a direction of running a supply line of the first potential and a supply line of the second potential.

10. A semiconductor integrated circuit characterized in that in a semiconductor integrated circuit having a cell comprising a logical operation circuit including at least one pass transistor circuit and at least one output signal amplifier:

wherein the pass transistor circuit in the logical operation circuit includes a first input node, a second input node and a third input node, an output node, a first field effect transistor of a first type or a second type, a source/drain path of which is connected between the first input node and the output node and a second field effect transistor of the first type or the second type, a source/drain path of which is connected between the second input node and the output node;

wherein the output signal amplifier in the logical operation circuit includes a circuit comprising an input node, an output node, a first field effect transistor of a first type, a drain/source path of which is connected between the output node and first potential and a gate of which responds to the input node, a second field effect transistor of a second type, a drain/source path of which is connected between the output node and second potential and a gate of which responds to the input node and a third field effect transistor of the first type, a drain/source path of which is connected between the input node and the first potential and a gate of which responds to the output node; and wherein in the output signal amplifier, wire connection from a drain of the third field effect transistor to the gates of the first field effect transistor and the second field effect transistor is realized by passing the wire connection below a supply line of the first potential by using a material for a gate terminal of the transistor.

11. A semiconductor integrated circuit characterized in a semiconductor integrated circuit including a plurality of cells, at least one of said plurality of cells comprising:

a plurality of pass transistor circuits each including a first input node, a second input node and a third input node, an output node, a field effect transistor, a source/drain path is connected between the first input node and the output node and a field effect transistor, a source/drain path of which is connected between the second input node and the output node; and an output signal amplifier including a circuit comprising an input node, an output node, a field effect transistor of a first type, a drain/source path of which is connected between the output node and first potential and a gate of which responds to the input node and a field effect transistor of a second type, a drain/source path is connected between the output node and second potential and a gate of which responds to the input node;

wherein the output node of the pass transistor circuit is connected to the input node of the output signal amplifier;

wherein any of the input nodes of the pass transistor circuit is supplied with an input signal from outside of the cell via an inverter arranged at inside of the cell; and wherein the output node of the output signal amplifier operates to output an output signal to outside of the cell.

12. The semiconductor integrated circuit apparatus according to claim 11, characterized in that a second cell of the cells includes the well of the first type and the well of the second type and a boundary line between the well of the first type and the well of the second type is in parallel with the first side of the cell.

13. The semiconductor integrated circuit apparatus according to claim 12, wherein the first cell and the second cell are contiguous to each other and at a contiguous portion, the boundary line between the well of the first type and the well of the second type of the first cell coincide with a boundary line between the well of the first type and the well of the second type of the second cell.

14. The semiconductor integrated circuit apparatus according to claim 12, wherein in the second cell, input and output terminals are arranged to align on a straight line.

15. The semiconductor integrated circuit apparatus according to claim 14, wherein the second cell includes a logical gate constituted by a CMOS transistor.

16. A semiconductor integrated circuit apparatus including a plurality of cells having shapes surrounded by a plurality of sides, wherein a first cell of the cells includes a well of a first type and a well of a second type and a boundary line between the well of the first type and the well of the second type is provided with a first portion in parallel with a first one of the sides and a second portion not in parallel therewith.

17. The semiconductor integrated circuit apparatus according to claim 16, wherein the first portion of the boundary between the wells intersects with a second and a third side intersecting with the first side.

18. The semiconductor integrated circuit apparatus according to claim 16, wherein the first cell includes an inverter receiving an input signal, a pass transistor receiving an output from the inverter and an amplifying circuit receiving an output from the pass transistor.

19. The integrated circuit apparatus according to claim 16, wherein the first cell includes an inverter of a first CMOS constitution, a transistor constituted by nMOS or pMOS inputting an output from the inverter and an inverter having a second CMOS constitution inputting an output from the transistor.

20. The integrated circuit apparatus according to claim 16, wherein the first cell includes a first circuit receiving an input from outside of the cell, a transistor constituted by nMOS or pMOS inputting an output from the first circuit and a second circuit inputting an output from the transistor wherein an output from the second circuit constitutes an output to outside of the cell and a gain of the second circuit is larger than a gain of the first circuit.

21. The integrated circuit apparatus according to claim 16, wherein the first cell includes an inverter receiving an input, a transistor constituted by either one of nMOS or pMOS inputting the input and an output from the inverter and an amplifying circuit for inputting an output from the transistor wherein an output from the amplifying circuit constitutes an output to outside of the cell.

22. The semiconductor integrated circuit apparatus according to claim 16, wherein in the first cell, input and output terminals are arranged not to align on a straight line.

23. A semiconductor integrated circuit apparatus, including:
a plurality of cells having a rectangular shape, at least one of the cells including an input terminal, an inverter of a CMOS constitution inputting an output from the input terminal as a gate input, a transistor constituted by nMOS or pMOS inputting an output from the inverter as a gate input, an amplifying circuit of a CMOS constitution inputting an output from the transistor as a gate input, and an output terminal outputting an output from the amplifying circuit to outside of the cell;
wherein a first potential supply line is provided along a first side of the cell, a second potential supply line is provided along a second side opposed to the first side, a pMOS transistor and an nMOS transistor constituting the amplifying circuit are arranged on cell inner sides of the first and the second potential supply lines and the transistor is arranged between the pMOS transistor and the nMOS transistor constituting the amplifying circuit.

24. The integrated circuit apparatus according to claim 23, wherein a pMOS transistor and an nMOS transistor constituting the inverter are arranged on the cell inner sides of the first and the second potential supply lines, and the transistor is arranged between the pMOS transistor and the nMOS transistor constituting the inverter.

25. The integrated circuit apparatus according to claim 23, wherein gate electrode wirings of the pMOS transistor and the nMOS transistor of the amplifying circuit having the CMOS constitution are arranged along a third side orthogonal to the first side and the second side.

26. The integrated circuit apparatus according to claim 25, when there are a plurality of the transistors constituted by nMOS or pMOS, the transistors are arranged from a side of a fourth side opposed to the third side to the third side and when an output from a first transistor among the plurality of transistors constitutes an input of a second transistor, the first transistor is disposed proximate to the fourth side and the second transistor is disposed proximate to the third side.

27. The integrated circuit apparatus according to claim 23, wherein a source potential of the transistor constituting the amplifying circuit and a source potential of the transistor constituting the inverter are made common.

* * * * *